US012581822B2

(12) United States Patent
Qu et al.

(10) Patent No.: US 12,581,822 B2
(45) Date of Patent: Mar. 17, 2026

(54) DISPLAY SUBSTRATE, DISPLAY DEVICE, AND WIRING METHOD

(71) Applicants: Chengdu BOE Optoelectronics Technology Co., Ltd., Chengdu (CN); BOE Technology Group Co., Ltd., Beijing (CN)

(72) Inventors: Yi Qu, Beijing (CN); Maoying Liao, Beijing (CN); Junxiu Dai, Beijing (CN); Lu Bai, Beijing (CN); Yang Zhou, Beijing (CN); Xin Zhang, Beijing (CN)

(73) Assignees: Chengdu BOE Optoelectronics Technology Co., Ltd., Chengdu (CN); BOE Technology Group Co., Ltd., Beijing (CN)

( * ) Notice: Subject to any disclaimer, the term of this patent is extended or adjusted under 35 U.S.C. 154(b) by 284 days.

(21) Appl. No.: 18/275,931

(22) PCT Filed: Oct. 22, 2021

(86) PCT No.: PCT/CN2021/125604
§ 371 (c)(1),
(2) Date: Aug. 4, 2023

(87) PCT Pub. No.: WO2022/174612
PCT Pub. Date: Aug. 25, 2022

(65) Prior Publication Data
US 2024/0130189 A1     Apr. 18, 2024

(30) Foreign Application Priority Data
Feb. 22, 2021     (CN) .......................... 202110199784.5

(51) Int. Cl.
*H10K 59/131*          (2023.01)
*H10K 59/00*           (2023.01)

(52) U.S. Cl.
CPC ....... *H10K 59/131* (2023.02); *H10K 59/1315* (2023.02); *H10K 59/00* (2023.02)

(58) Field of Classification Search
CPC ... H10K 59/131; H10K 59/1315; H10K 59/00
See application file for complete search history.

(56) References Cited

U.S. PATENT DOCUMENTS 8,797,491 B2     8/2014  Kim et al.
11,144,168 B1 *  10/2021  Lin ........................ G06F 3/0448
(Continued)

FOREIGN PATENT DOCUMENTS

CN          1988744 A      6/2007
CN          103995373 A    8/2014
(Continued)

OTHER PUBLICATIONS

CN202110199784.5 first office action dated Nov. 15, 2024.
PCT/CN2021/125604 international search report.

*Primary Examiner* — Mohsen Ahmadi
(74) *Attorney, Agent, or Firm* — IPro, PLLC

(57) ABSTRACT

Provided is a display substrate. The display substrate includes: a display region and a bonding region on a side of the display region, wherein the display region includes a plurality of pixel columns; and a wiring structure, disposed between the display region and the bonding region and including a plurality of traces, wherein one of the plurality of traces corresponds to one of the plurality of pixel columns, the plurality of traces are electrically connected to the plurality of pixel columns to supply an electric signal to pixels, and each of the plurality of traces includes a plurality of sub-traces, wherein at least one of line lengths and line widths of sub-traces corresponding to at least a part of the (Continued)

plurality of traces are different, such that total resistances of the at least the part of the plurality of traces are basically equal.

18 Claims, 15 Drawing Sheets

(56) References Cited

U.S. PATENT DOCUMENTS

| 2007/0080433 | A1 |  | 4/2007 | Lai |
| 2016/0365062 | A1 |  | 12/2016 | Wu et al. |
| 2017/0250203 | A1 | * | 8/2017 | Kim ..................... H10D 86/021 |
| 2018/0108843 | A1 | * | 4/2018 | Koo ..................... H10K 71/621 |
| 2019/0181210 | A1 | * | 6/2019 | Baek ..................... H10D 86/60 |
| 2019/0265568 | A1 | * | 8/2019 | Chen ................. G02F 1/136286 |
| 2020/0058723 | A1 | * | 2/2020 | Lee ..................... G09G 3/3233 |
| 2020/0175917 | A1 |  | 6/2020 | Jo et al. |
| 2021/0366378 | A1 | * | 11/2021 | Zhao ..................... G09F 9/302 |

FOREIGN PATENT DOCUMENTS

| CN | 105204248 | A | 12/2015 |
| CN | 103337233 | B | 3/2016 |
| CN | 106226963 | A | 12/2016 |
| CN | 106297623 | A | 1/2017 |
| CN | 206098394 | U | 4/2017 |
| CN | 107102488 | A | 8/2017 |
| CN | 208077535 | U | 11/2018 |
| CN | 109656067 | A | 4/2019 |
| CN | 109830207 | A | 5/2019 |
| CN | 111261669 | A | 6/2020 |
| CN | 215451419 | U | 1/2022 |

* cited by examiner

100

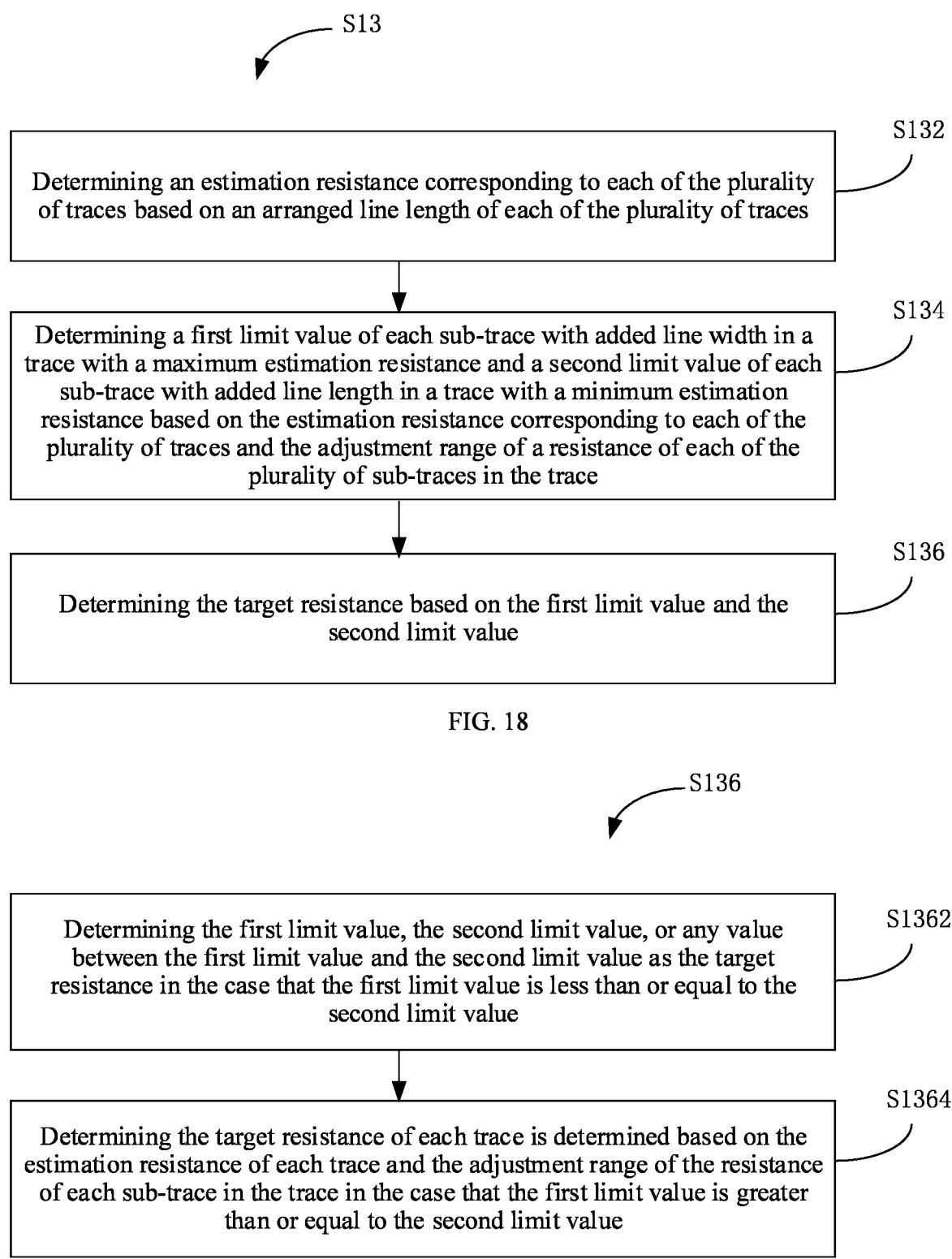

S13

S132

Determining an estimation resistance corresponding to each of the plurality of traces based on an arranged line length of each of the plurality of traces

S134

Determining a first limit value of each sub-trace with added line width in a trace with a maximum estimation resistance and a second limit value of each sub-trace with added line length in a trace with a minimum estimation resistance based on the estimation resistance corresponding to each of the plurality of traces and the adjustment range of a resistance of each of the plurality of sub-traces in the trace

S136

Determining the target resistance based on the first limit value and the second limit value

Determining the first limit value, the second limit value, or any value between the first limit value and the second limit value as the target resistance in the case that the first limit value is less than or equal to the second limit value

S1364

Determining the target resistance of each trace is determined based on the estimation resistance of each trace and the adjustment range of the resistance of each sub-trace in the trace in the case that the first limit value is greater than or equal to the second limit value

FIG. 19

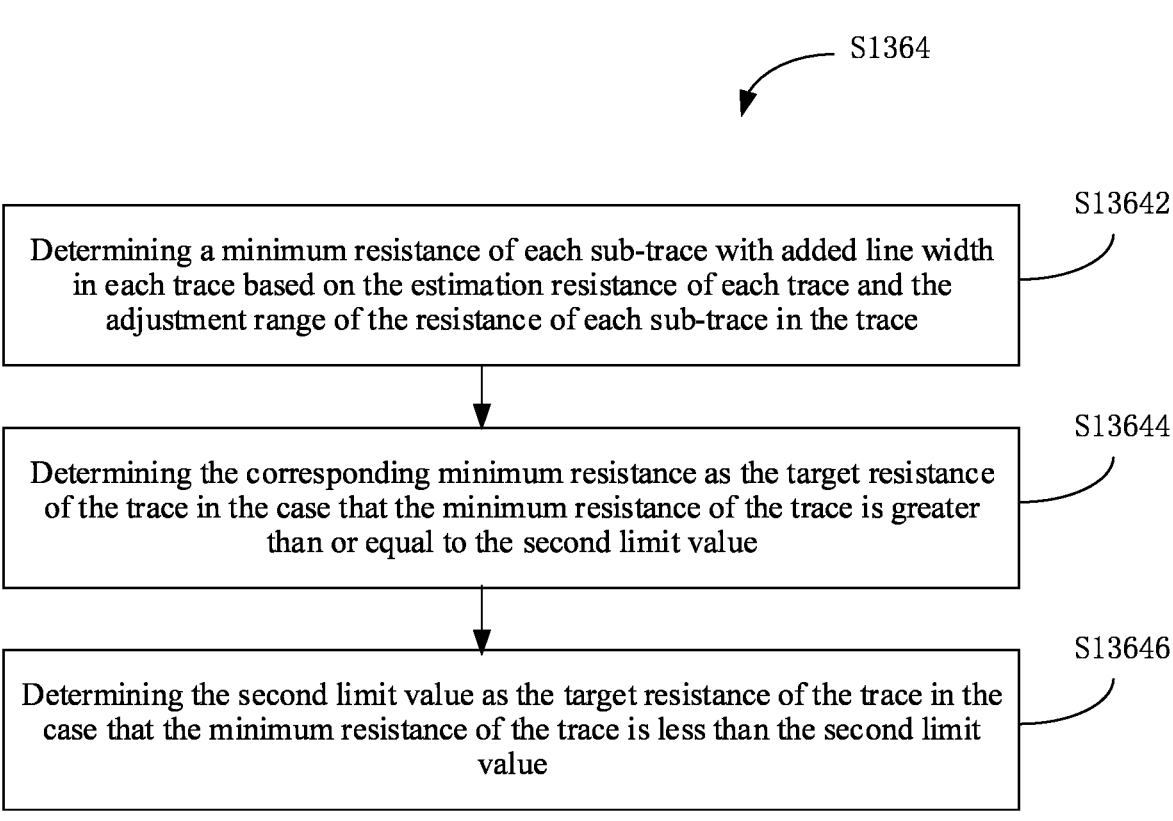

S1364

S13642

Determining a minimum resistance of each sub-trace with added line width in each trace based on the estimation resistance of each trace and the adjustment range of the resistance of each sub-trace in the trace

S13644

Determining the corresponding minimum resistance as the target resistance of the trace in the case that the minimum resistance of the trace is greater than or equal to the second limit value

S13646

Determining the second limit value as the target resistance of the trace in the case that the minimum resistance of the trace is less than the second limit value

FIG. 20

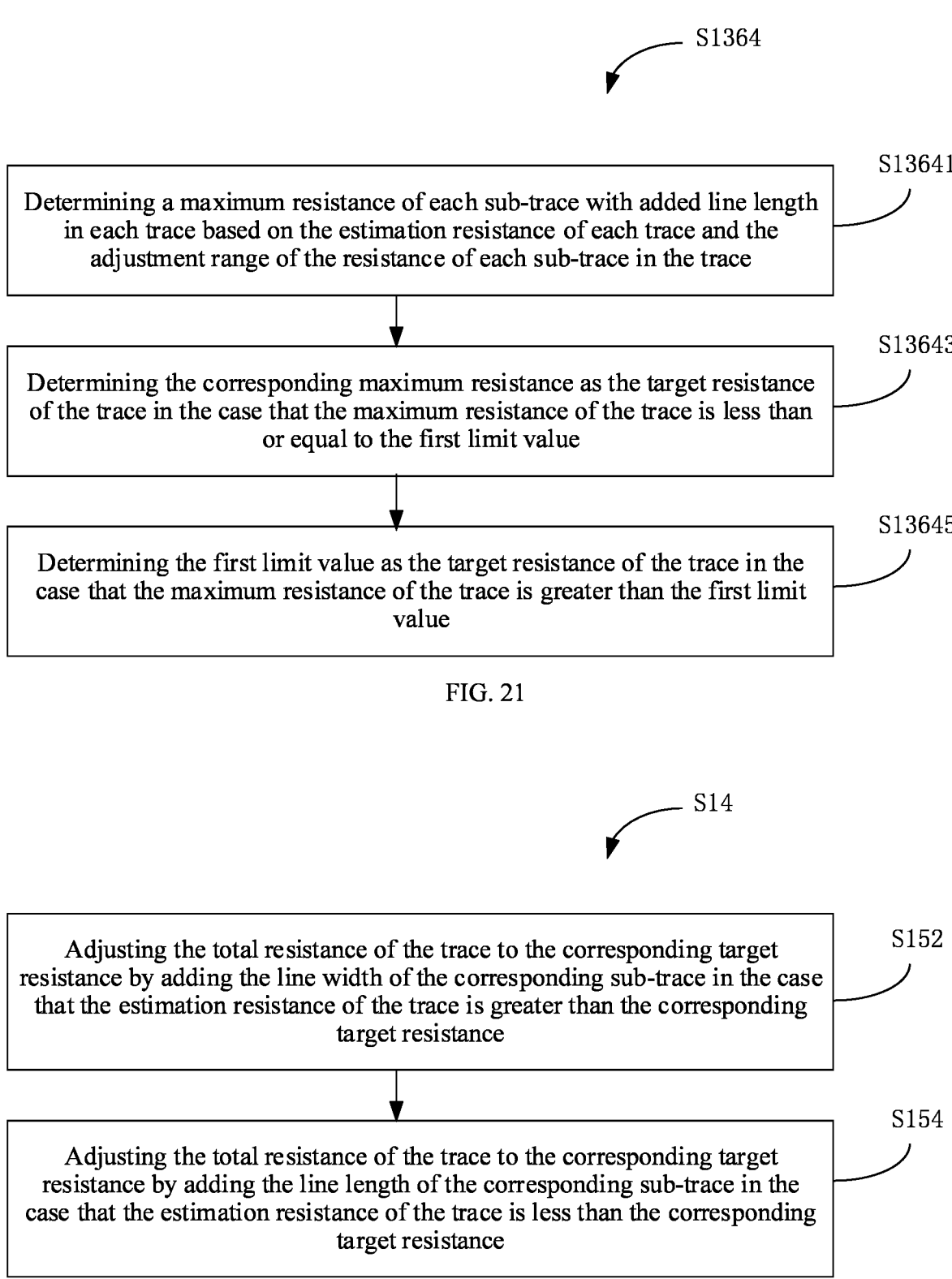

S1364

Determining a maximum resistance of each sub-trace with added line length in each trace based on the estimation resistance of each trace and the adjustment range of the resistance of each sub-trace in the trace

S13641

Determining the corresponding maximum resistance as the target resistance of the trace in the case that the maximum resistance of the trace is less than or equal to the first limit value

S13643

Determining the first limit value as the target resistance of the trace in the case that the maximum resistance of the trace is greater than the first limit value

Adjusting the total resistance of the trace to the corresponding target resistance by adding the line width of the corresponding sub-trace in the case that the estimation resistance of the trace is greater than the corresponding target resistance

S152

Adjusting the total resistance of the trace to the corresponding target resistance by adding the line length of the corresponding sub-trace in the case that the estimation resistance of the trace is less than the corresponding target resistance

DISPLAY SUBSTRATE, DISPLAY DEVICE, AND WIRING METHOD

CROSS-REFERENCE TO RELATED APPLICATION

This application is a U.S. national stage of international application No. PCT/CN2021/125604, filed on Oct. 22, 2021, and is based on and claims priority to Chinese Patent Application No. 202110199784.5 filed on Feb. 22, 2021, the disclosures of which are herein incorporated by references in their entireties.

TECHNICAL FIELD

The present disclosure relates to the field of display technologies, and in particular, relates to a display substrate, a display device, and a wiring method.

BACKGROUND OF THE INVENTION

At present, an organic light-emitting display (OLED) screen generally adopts a bonding process, such as chip on pi (COP) or chip on film (COF). In the case that the OLED display screen adopts the bonding process of the COP or COF, a driver integrated circuit (IC) is electrically connected to pixels in the display screen through a plurality of fan-out conduction lines.

SUMMARY OF THE INVENTION

In view of this, the embodiments of the present disclosure provide a display substrate, a display device, and a wiring method.

The display substrate in the embodiments of the present disclosure includes: a display region and a bonding region on a side of the display region, wherein the display region includes a plurality of pixel columns that are sequentially arranged; and a wiring structure, disposed between the display region and the bonding region and including a plurality of traces that are sequentially arranged, wherein one of the plurality of traces corresponds to one of the plurality of pixel columns, the plurality of traces are electrically connected to the plurality of pixel columns to supply an electric signal to pixels in the plurality of pixel columns, and each of the plurality of traces includes a plurality of sub-traces, wherein at least one of line lengths and line widths of sub-traces corresponding to at least a part of the plurality of traces are different, such that total resistances of the at least a part of the plurality of traces are basically equal.

In some embodiments, the wiring structure includes a first wiring space, a second wiring space, and a third wiring space that are sequentially arranged, wherein the first wiring space is proximal to the display region, and the plurality of sub-traces are arranged in at least one of the first wiring space, the second wiring space, and the third wiring space.

In some embodiments, in the first wiring space, each of the plurality of sub-traces includes a first adjustment trace with a line length within a unit distance greater than a predetermined length, wherein line lengths of the first adjustment traces are sequentially increased in a direction from a side edge of the display region to a center of the display region.

In some embodiments, the second wiring space includes a first region and a second region that are disposed proximal to a side edge of the display region and are adjacent to each other, wherein in the first region, each of the plurality of sub-traces includes a first adjustment trace, wherein line lengths of the first adjustment traces are sequentially increased in a direction from the side edge of the display region to a center of the display region; and in the second region, each of the plurality of sub-traces includes a second adjustment trace with a line width greater than a predetermined width, wherein line lengths of the second adjustment traces are sequentially reduced in the direction from the side edge of the display region to the center of the display region.

In some embodiments, the second wiring space includes a third region including a plurality of sub-regions, wherein in each of the plurality of sub-regions, each of the plurality of sub-traces includes a first adjustment trace, wherein line lengths of the first adjustment traces are sequentially increased in a direction from a side edge of the display region to a center of the display region.

In some embodiments, the plurality of sub-regions include a first sub-region and a second sub-region that are adjacent, wherein in the first sub-region, the line lengths of the first adjustment traces are sequentially increased from a first line length in the direction from the side edge of the display region to the center of the display region; and in the second sub-region, the line lengths of the first adjustment traces are sequentially increased from a second line length in the direction from the side edge of the display region to the center of the display region, and the second line length is greater than the first line length.

In some embodiments, the third wiring space includes a fourth region and a fifth region that are adjacent, wherein sub-traces in the fourth region include a second adjustment trace, wherein line lengths of the second adjustment traces are sequentially reduced in a direction from a side edge of the display region to a center of the display region; and sub-traces in the fifth region include a first adjustment trace, wherein line lengths of the first adjustment traces are sequentially increased in a direction from the side edge of the display region to the center of the display region.

In some embodiments, the wiring structure includes a fourth wiring space including a sixth region and a seventh region that are adjacent, wherein sub-traces in the sixth region include a second adjustment trace, wherein line lengths of the second adjustment traces are sequentially reduced in a direction from a side edge of the display region to a center of the display region; and sub-traces in the seventh region include a first adjustment trace, wherein line lengths of the first adjustment traces are sequentially increased in the direction from the side edge of the display region to the center of the display region.

In some embodiments, the wiring structure further includes: a first connection space, wherein the first connection space is disposed between the first wiring space and the second wiring space, and each of the plurality of traces includes a connection sub-trace in the first connection space; and a second connection space, wherein the second connection space is disposed between the second wiring space and the third wiring space, and each of the plurality of traces includes a connection sub-trace in the second connection space.

In some embodiments, each of the plurality of sub-traces includes a first adjustment trace bending and extending in a wiring direction.

In some embodiments, the display substrate further includes: a conduction line, wherein the conduction line is configured to be bonded with a flexible circuit board, and includes a first power signal line and a second power signal line, wherein the first power signal line is configured to supply a first power voltage to the pixels, and the second power signal line is configured to supply a second power voltage to the pixels.

In some embodiments, the display substrate further includes: a first conduction layer and a second conduction layer, wherein adjacent traces are respectively disposed in the first conduction layer and the second conduction layer.

In some embodiments, the pixel includes at least one thin-film transistor and storage capacitor;

the at least one thin-film transistor includes an active layer on the base substrate, a first gate insulation layer on a side, distal from the base substrate, of the active layer, a gate on a side, distal from the base substrate, of the first gate insulation layer, a second gate insulation layer on a side, distal from the base substrate, of the gate, an interlayer insulation layer on a side, distal from the base substrate, of the second gate insulation layer, and a source and drain on a side, distal from the base substrate, of the interlayer insulation layer; and the storage capacitor includes a first plate and a second plate, wherein the first plate and the gate are disposed on a same layer, and the second plate is disposed between the second gate insulation layer and the interlayer insulation layer.

In some embodiments, at least a part of the plurality of traces and the first plate are disposed on a same layer, and at least a part of the plurality of traces and the second plate are disposed on a same layer, and the at least the part of the plurality of traces on the same layer as the first plate and the at least the part of the plurality of traces on the same layer as the second plate are alternately disposed.

The display device in the embodiments of the present disclosure includes the display substrate according to any one of the above embodiments.

The wiring method in the embodiments of the present disclosure is applicable to the above display device, and the method includes:

acquiring the plurality of traces in the wiring structure;

calculating an adjustment range of a resistance of each of the plurality of sub-traces based on an arranged line length of each of the plurality of sub-traces in each of the plurality of traces;

determining a target resistance based on the adjustment range of the resistance of each of the plurality of sub-traces in each of the plurality of traces; and adjusting the total resistance of each of the plurality of traces to the target resistance by disposing line lengths or line widths of corresponding sub-traces based on an arrangement of the plurality of sub-traces.

BRIEF DESCRIPTION OF DRAWINGS

Above and/or additional aspects and advantages of the present disclosure will be obvious and easily understood from the following description of the embodiments in conjunction with the accompanying drawings.

FIGS. 17 to 22 are flow charts of a wiring method according to some embodiments of the present disclosure.

DETAILED DESCRIPTION OF THE INVENTION

Figure 1:
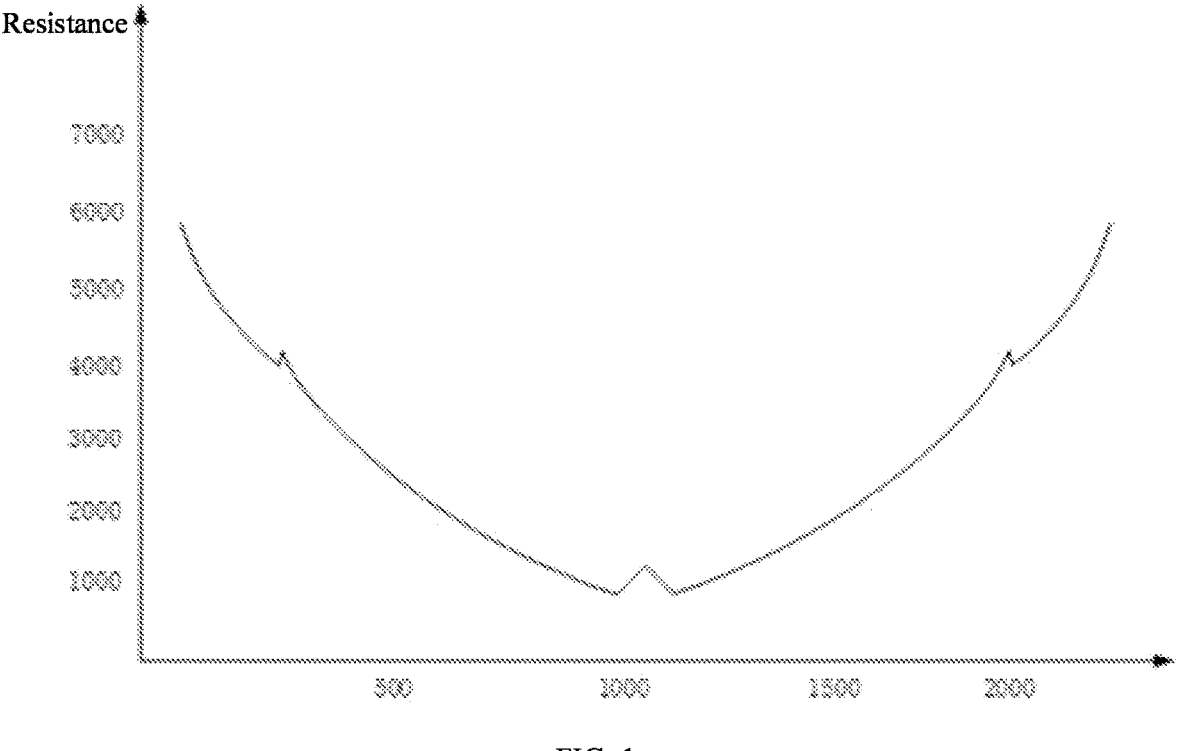
FIG. 1 is a schematic diagram of resistance distribution of fan-out conduction lines in some practices.

The embodiments of the present disclosure are described hereinafter in detail, examples of which are illustrated in the accompanying drawings. Throughout the accompanying drawings, the same or similar reference signs represent the same or similar components or components with the same or similar functions. The embodiments described below with reference to the accompanying drawings are exemplary, and are only intended to explain the present disclosure, rather than to limit the present disclosure.

In the descriptions of the present specification, it should be noted that the orientation or position relations indicated via terms of "center," "longitudinal," "transverse," "length," "width," "thickness," "up," "down," "front," "back," "left," "right," "vertical," "horizontal," "top," "bottom," "inside," "outside," "clockwise," "counterclockwise," and the like are based on orientation or the position relations shown in the drawings. They are merely for the purpose of being convenient to describe the present disclosure and simplifying description, but not to indicate or imply that the described device or member must have the particular orientation or must be constructed and operated with the particular orientation, so that they should not be construed as limitations on the present disclosure. In addition, the terms "first," "second," and the like are only used for the purpose of description and should not be construed as indicating or implying relative importance or implicitly indicating the number of technical features as indicated. Thus, features defined by the terms "first" and "second" can explicitly or implicitly include one or more of the features. Unless otherwise clearly defined, the expression "a plurality of" refers to two or more.

In the description of the present disclosure, it should be noted that unless otherwise expressly specified and limited, the terms "disposing", "connection" and "connecting" shall be understood broadly, for example, may be fixed connections, removable connections, or integrated connections; may be mechanical connection, electrical connection or communicate with each other; directly connection, indirectly connection through an intermediate medium, connection within two components or the interaction between two components. A person of ordinary skill in the art can understand the specific meaning of the above terms in the present disclosure based on specific cases.

The following description provide some different embodiments or examples to achieve different structures of the present disclosure. For simplifying the present disclosure, parts and arrangements of the specific embodiments are described hereinafter. They are merely examples, and are not intended to limit the present disclosure. In addition, the reference numerals and/or reference letters can be repeated bin different embodiments in the present disclosure, and the repetition is for purpose of simplifying and clearing, and is no intended to indicate relations between the described embodiments and/or arrangements. In addition, examples of specific processes and materials are provided in the present disclosure, and a person of ordinary skill in the art can acquire uses of other processes and/or materials.

With increasingly improvement and optimization of OLED technology, OLED products have shown a huge market potential, the OLED products are widely used due to an excellent display property, and requirements for the display property of the screen are stricter with the increasingly rich products.

At present, according to the way of bonding IC, back plates of most OLED products on the market are divided into three types, that is, chip on pi (COP), chip on film (COF), and chip on glass (COG). Integrated circuit (IC) chips of the COF products are integrated in a flexible printed circuit and are bent to a bottom of the screen, and a front face of the substrate includes a COF pin. IC chips of the COG products are disposed on a back plate. That is, the back plate includes an output pin and an input pin. The IC chips of the COG products are bonded to driver IC chips of modules through the output pin and the input pin, and the IC chips are not bent to a back face, such that a frame of the COG product is generally great. The COP and COG differ in that the substrate of the COP is flexible while the substrate of the COG is glass, and other portions of the COP and COG are basically the same.

In conjunction with FIG. 1, limited by the bonding process, the longer the fan-out conduction lines corresponding to pixel columns proximal to two sides of the display screen, the greater the resistance of the fan-out conduction lines proximal to two sides of the display screen with the increment of the length of the traces. It can be seen from a driving current formulation I=K*(Vsg−|Vth|)2=K*(VDD−Vdata−|Vth|)2 that in the case that VDD is a constant, the driving current changes with the change of the data signal Vdata, and the display luminance of the OLED is positively correlated with the driving current. Thus, in the OLED product, the display luminance of the OLED is affected by the data signal Vdata. In transmitting the data signal Vdata from the driver chip on the COP or COF to the pixel column of the display screen, due to the partial voltage of the resistance of the fan-out conduction line, a difference between the Vdata at positions proximal to two sides of the display screen and the Vdata at positions proximal to the display center region of the display screen caused by the difference in the resistance of the source lines causes the uniform luminance, and thus the display effect is affected. In addition, in the case that the size of the frame is reduced, a wiring space in an extension direction of the fan-out conduction line is reduced, a difference in the lengths of the fan-out conduction lines on two sides of the screen and the center of the screen is increased, and a difference in the resistances of the fan-out conduction lines on two sides of the screen and the center of the screen is further increased, such that the luminance at the position proximal to the display center of the display screen and the luminance at two sides of the display screen are not uniform, and the display effect of the display screen is affected.

Figure 2:
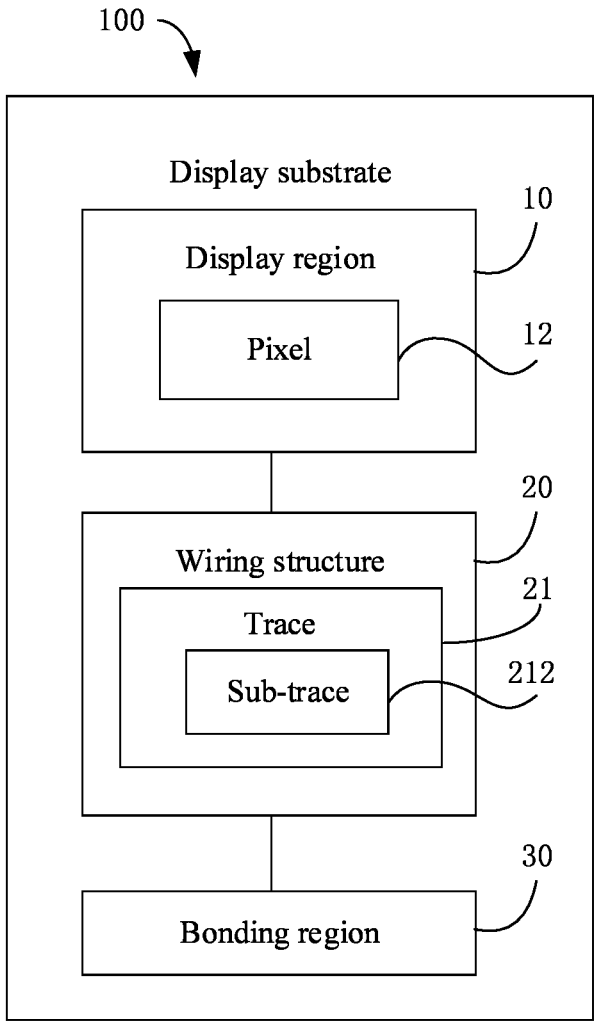
FIG. 2 is a schematic diagram of modules of a display substrate according to some embodiments of the present disclosure.
Figure 3:
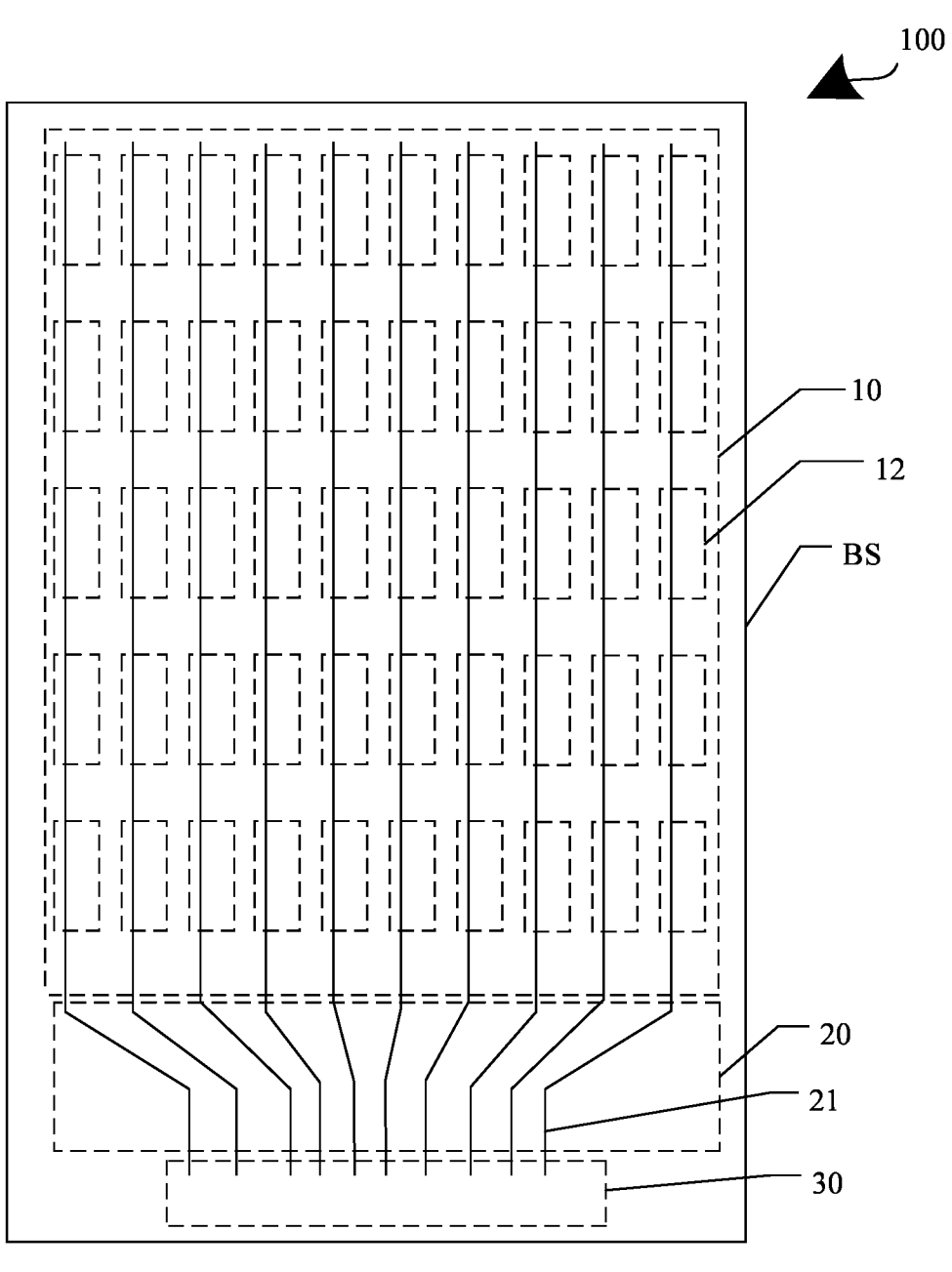
FIG. 3 is a schematic planar diagram of a display substrate according to some embodiments of the present disclosure.
Figures 4, 5:
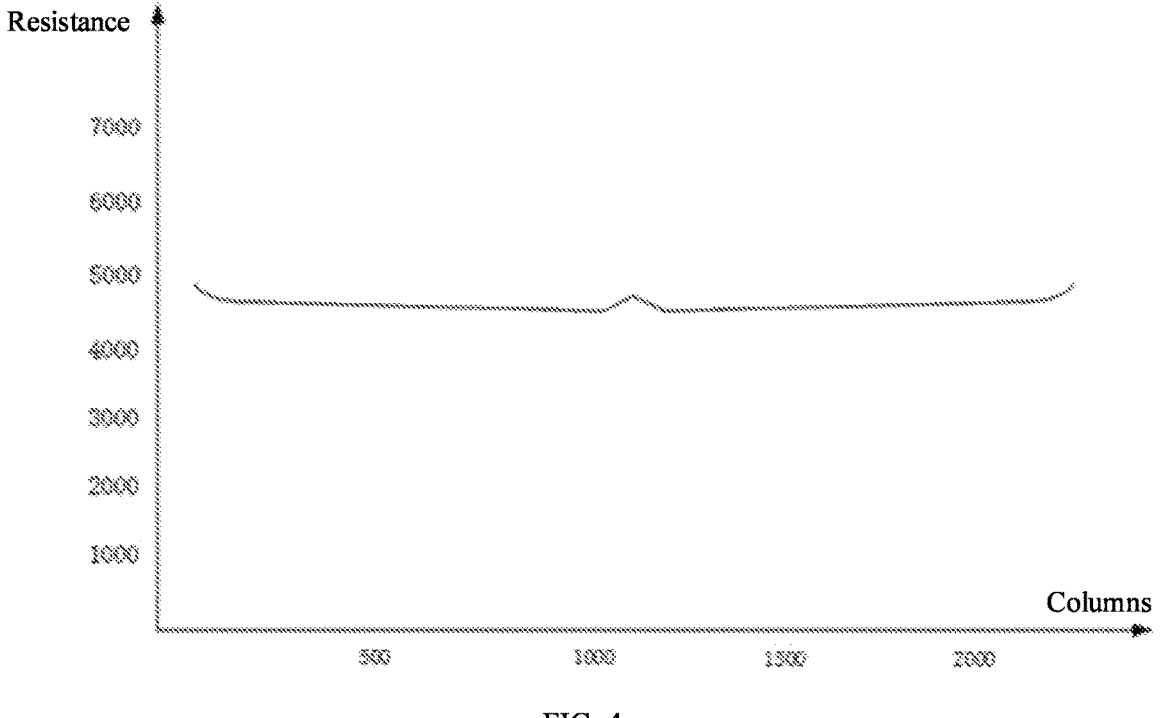
FIG. 4 is a schematic diagram of resistance distribution of traces according to some embodiments of the present disclosure.
FIG. 5 is a schematic diagram of modules of a wiring structure according to some embodiments of the present disclosure.

In view of this, referring to FIG. 2, FIG. 3 and FIG. 4, the embodiments of the present disclosure provide a display substrate 100. The display substrate 100 includes a display region 10, a bonding region 30, and a wiring structure 20. The display region 10 includes a plurality of pixel columns that are sequentially arranged, and the pixel column includes a plurality of pixels 12. The wiring structure 20 includes a plurality of traces 21 that are sequentially arranged. One of the plurality of traces 21 corresponds to one of the plurality of pixel columns, and the plurality of traces 21 are connected to the plurality of pixel columns to supply an electric signal to pixels 12 in the plurality of pixel columns.

Each of the plurality of traces 21 includes a plurality of sub-traces 212. At least one of line lengths and line widths of sub-traces 212 corresponding to at least a part of the plurality of traces 21 are different, such that total resistances of the at least the part of the plurality of traces 21 are basically equal.

In the display substrate 10 in the present disclosure, by disposing the line lengths or the line widths of sub-traces 212 corresponding to the traces 21, the total resistances of the traces 21 are basically equal, such that the difference in driving current of pixels 12 due to the partial voltage of the resistance of the trace caused by the great difference of the resistances of the traces is avoided, and the luminance uniformity of the pixels is improved. As such, the difference between the luminance at the edge and the luminance at the center of the display region 10 is less, and the display effect is improved.

It should be noted that the bonding region 30 is provided with a driver chip (the integrated circuit), and the driver chip is electrically connected to the trace 21 and supplies the electric signal to the pixels 12 in the display region 10 through the trace 21. The electric signal may be a current and a voltage, that is, the driver chip supplies the current or the voltage to the pixels 12 through the trace 21, such that the pixels in the display region 10 emit light and display an image.

Referring to FIG. 5, the wiring structure 20 further includes a first wiring space 22, a second wiring space 23, a third wiring space 24, and a fourth wiring space 25 that are sequentially arranged. The first wiring space 22 is proximal to the display region 10, and the fourth wiring space 25 is proximal to the bonding region 30.

At least a part of trace 21 includes at least one of the sub-trace 212 in the first wiring space 22, the sub-trace 212 in the second wiring space 23, the sub-trace 212 in the third wiring space 24, and the sub-trace 212 in the fourth wiring space 25. The sub-trace 212 in the first wiring space 22 is connected to the pixel column in the display region 10, and the sub-trace 212 in the fourth wiring space 25 is connected to the bonding region 30.

In different wiring spaces, the line lengths or line widths of the sub-trace 212 of different traces 21 are different. That is, in the present disclosure, the total resistances of the traces 21 are close by disposing the corresponding sub-traces 212 in the first wiring space 22, the second wiring space 23, the third wiring space 24, and the fourth wiring space 25 (for example, the resistance distribution of the traces shown in FIG. 4). It can be understood that the resistance of the sub-trace 212 is positively correlated with the length of the sub-trace 212, and the resistance of the sub-trace 212 is negatively correlated with the width of the sub-trace 212. That is, the greater the length of the sub-trace 212, the greater the resistance of the sub-trace 212. The greater the width of the sub-trace 212, the less the resistance of the sub-trace 212.

The sub-trace 212 in the first wiring space 22, the sub-trace 212 in the second wiring space 23, the sub-trace 212 in the third wiring space 24, and the sub-trace 212 in the fourth wiring space 25 are coordinated hereinafter to acquire the resistance distribution of the traces 21 shown in FIG. 4.

Figure 6:
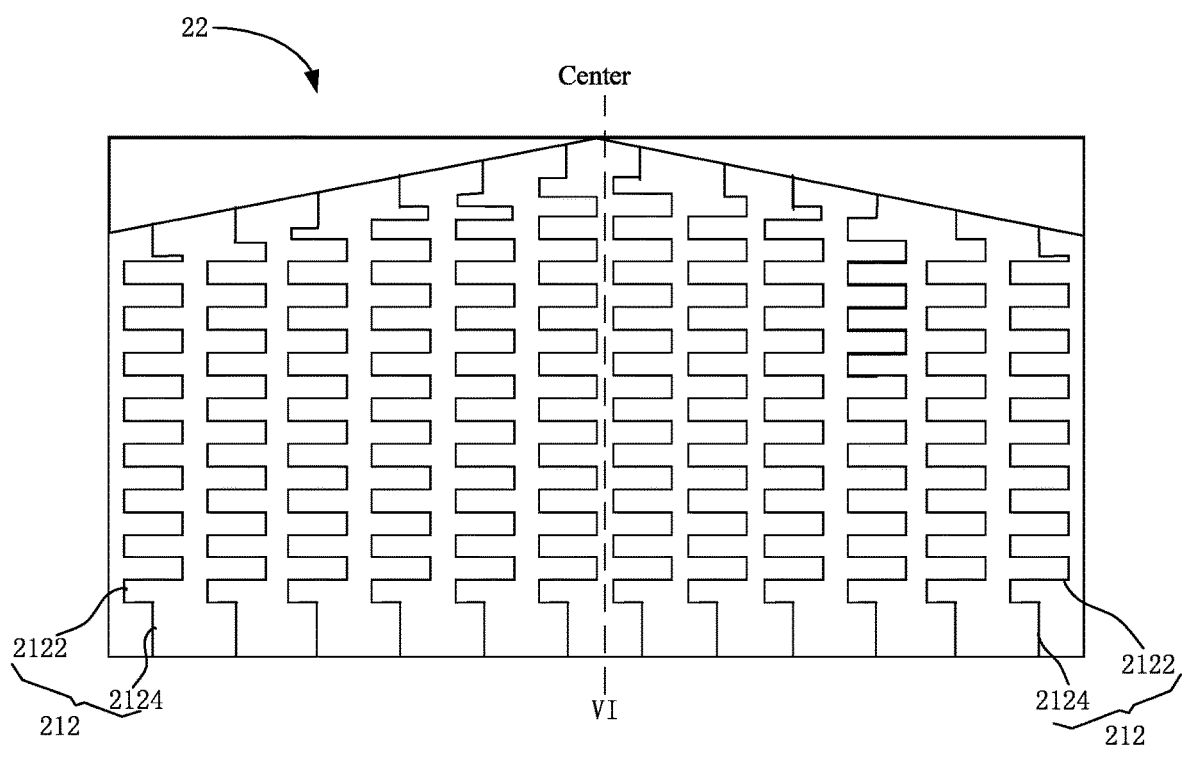
FIG. 6 is a schematic partially diagram of a first wiring space at a position of "VI" shown in FIG. 5.

In conjunction with FIG. 6, in some embodiments, in the first wiring space 22, the sub-trace 212 includes a non-adjustment sub-trace 2124 and a first adjustment trace 2122 with a line length within a unit distance greater than a predetermined length. Line lengths of the first adjustment traces 2122 are sequentially increased in a direction from a side edge of the display region 10 to a center of the display region 10.

The first adjustment trace 2122 is configured to adjust the resistance of the sub-trace 212 in the first wiring space 22. In addition, in the first wiring space 22, the greater the ratio of line length of the first adjustment trace 2122 to the sub-trace 212, the greater the resistance of the sub-trace 212.

Figure 7:
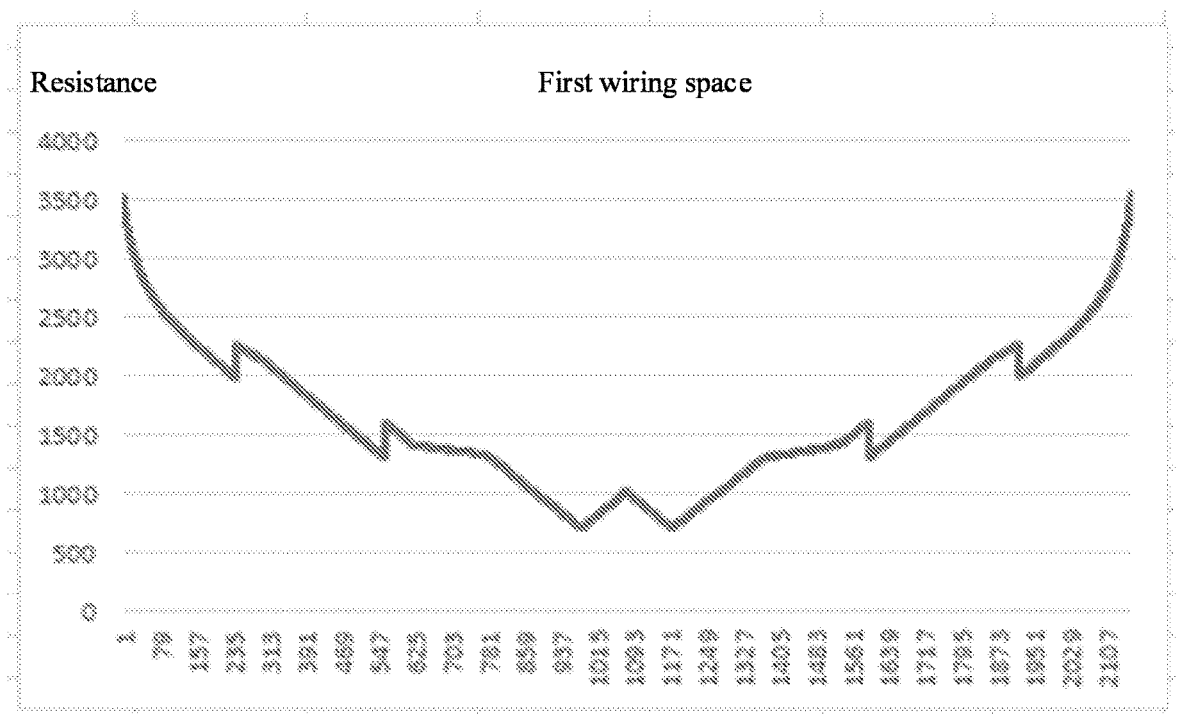
FIG. 7 is a schematic diagram of resistance distribution of sub-traces in the first wiring space.

In addition, the line width of the first adjustment trace 2122 is the same as or less than the line width of the non-adjustment sub-trace 2124. In addition, the first adjustment trace 2122 is bent and extended in a wiring direction. It should be understood that with the predetermined length, the bending and extending of the first adjustment trace 2122 cause the length of the first adjustment trace 2122 to be greater and the resistance of the first adjustment trace 2122 to be greater. It should be understood that as the line lengths of the sub-traces 212 are sequentially reduced in the direction from the side edge of the display region 10 to the center of the display region 10 in the first wiring space 22, that is, the resistances of the sub-traces 212 are sequentially reduced in the direction from the side edge of the display region 10 to the center of the display region 10 in the first wiring space 22, the line lengths of the first adjustment traces 2122 are set to be sequentially increased in the direction from the side edge of the display region 10 to the center of the display region 10 in the first wiring space 22, and the resistances of the sub-traces 212 are sequentially increased in the direction from the side edge of the display region 10 to the center of the display region 10, such that the resistance distribution of the sub-traces 212 in the first wiring space 22 is shown in FIG. 7. As such, the different in resistances of the traces 21 is reduced, and the difference in luminance between the center of the display region 10 and two sides of the display region 10 is reduced.

Figure 8:
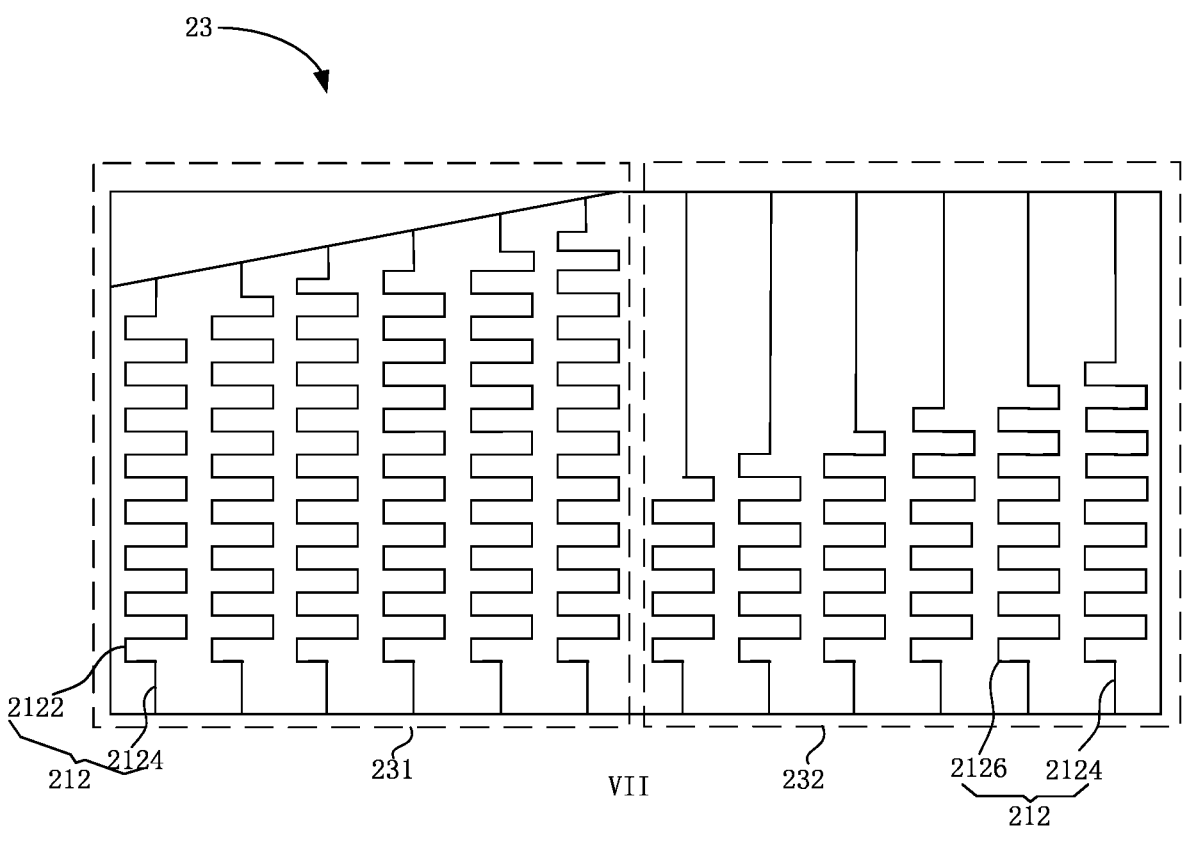
FIG. 8 is a schematic partially diagram of a first region and a second region in a second wiring space at a position of "VII" shown in FIG. 5.

In conjunction with FIG. 8, in some embodiments, the second wiring space 23 includes a first region 231 and a second region 232 that are disposed proximal to a side edge of the wiring structure 20 and are adjacent to each other. In the first region 231, each of the plurality of sub-traces 212 includes a first adjustment trace 2122. Line lengths of the first adjustment traces 2122 are sequentially increased in a direction from the side edge of the display region 10 to a center of the display region 10. In the second region 232, each of the plurality of sub-traces 212 includes a second adjustment trace 2126 with a line width greater than a predetermined width. The line lengths of the second adjustment traces 2126 are sequentially reduced in the direction from the side edge of the display region 10 to the center of the display region 10.

It should be noted that in the second wiring space 23, the greater a ratio of the second adjustment trace 2126 to the sub-trace 212, the less the resistance of the sub-trace 212. That is, the resistances of the sub-traces 212 are reduced by setting the second adjustment traces 2126. As such, in the first region 231, the resistances of the sub-traces 212 are increased in the direction from the side edge of the display region 10 to the center of the display region 10 by setting the first adjustment traces 2122. In the second region 231, the resistances of the sub-traces 212 are sequentially increased in the direction from the side edge of the display region 10 to the center of the display region 10 by setting the second adjustment traces 2126.

Figure 9:
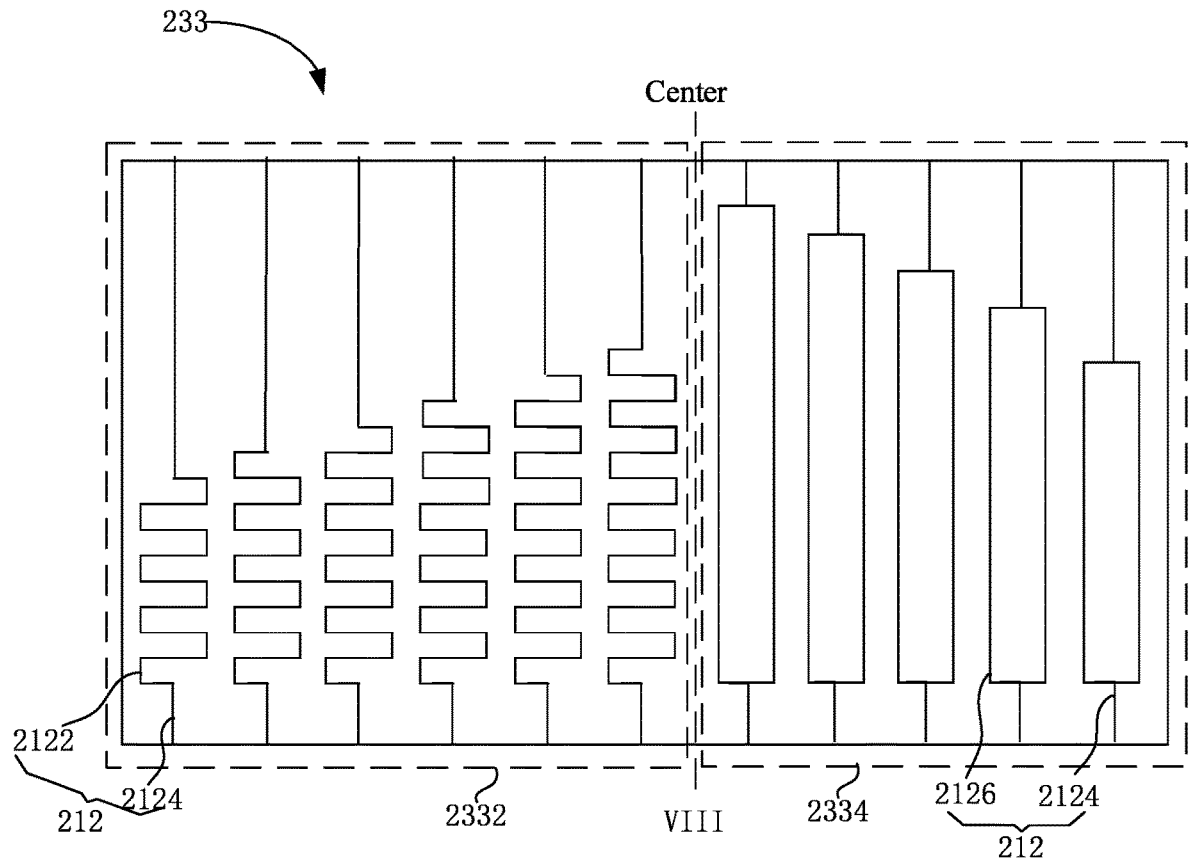
FIG. 9 is a schematic partially diagram of a third region in a second wiring space at a position of "VII" shown in FIG. 5.

Referring to FIG. 9, in some embodiments, the second wiring space 23 includes a third region 233. The third region 233 includes a plurality of sub-regions, and the sub-trace 212 includes a first adjustment trace 2122. Line lengths of the first adjustment traces 2122 are sequentially increased in a direction from a side edge of the display region 10 to a center of the display region 10.

Specifically, the plurality of sub-regions include a first sub-region 2332 and a second sub-region 2334 that are adjacent. In the first sub-region 2332, the line lengths of the first adjustment traces 2122 are sequentially increased in from a first line length in the direction from the side edge of the display region 10 to the center of the display region 10. In the second sub-region 2334, the line lengths of the first adjustment traces 2126 are sequentially increased from a second line length in the direction from the side edge of the display region 10 to the center of the display region 10, and the second line length is greater than the first line length.

It should be noted that the first line length is a length of a sub-trace 212, most proximal to the side edge of the wiring structure 20, of the first sub-region 2332, and the second line length is a length of a sub-trace 212, most proximal to the side edge of the wiring structure 20, of the second sub-region 2334.

Figure 10:
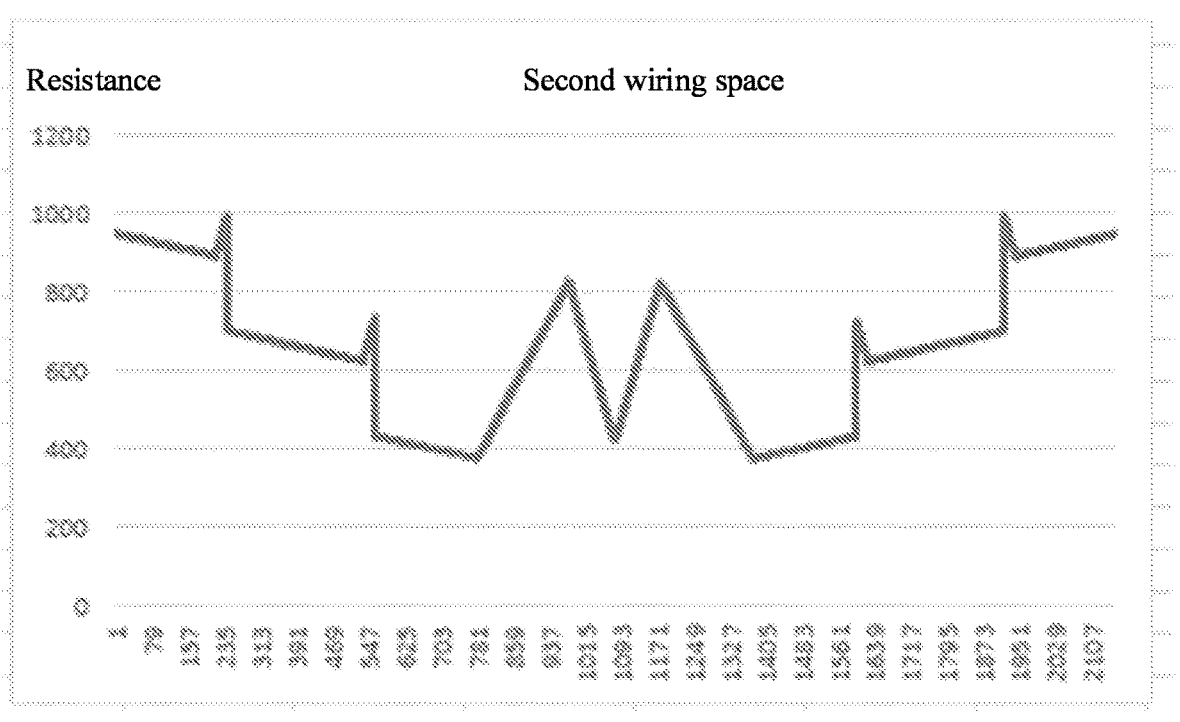
FIG. 10 is a schematic diagram of resistance distribution of sub-traces in the second wiring space.

As such, in the first sub-region 2332 of the third region 233, the resistances of the sub-traces 212 are sequentially increased in the direction from the side edge of the display region 10 to the center of the display region 10. In the second sub-region 2334 of the third region 233, the resistances of the sub-traces 212 are sequentially increased in the direction from the side edge of the display region 10 to the center of the display region 10. Thus, the resistance distribution of the sub-traces 212 in the second wiring space 23 is shown in FIG. 10, a difference in the total resistances of the traces 21 is further reduced, and the difference in the luminance of the center of the display region 10 and the luminance of the two sides of the display region 10 is reduced.

Figure 11:
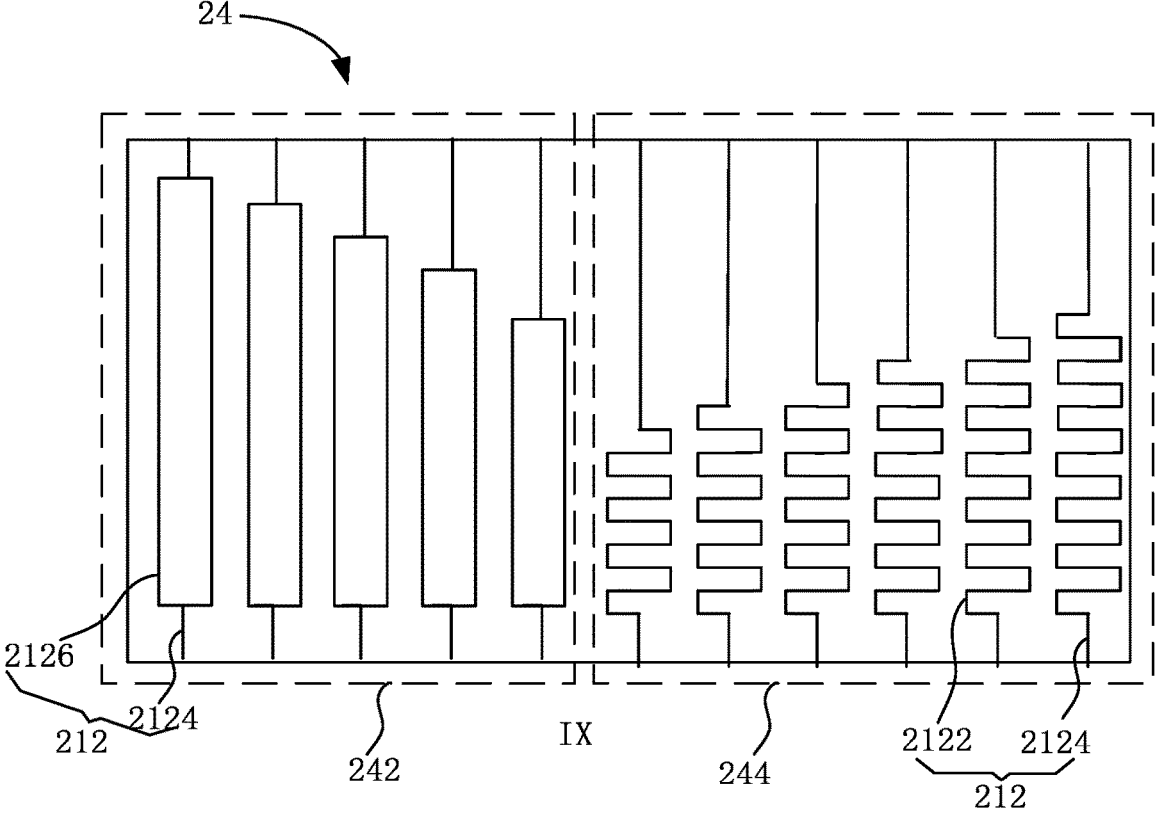
FIG. 11 is a schematic partially diagram of a fourth region and a fifth region in a third wiring space at a position of "IX" shown in FIG. 5.

In conjunction with FIG. 11, in some embodiments, the third wiring space 24 includes a fourth region 242 and a fifth region 244 that are adjacent. Sub-traces 212 in the fourth region 242 include a second adjustment trace 2126. Line lengths of the second adjustment traces 2126 are sequentially reduced in a direction from a side edge of the display region 10 to a center of the display region 10. Sub-traces 212 in the fifth region 244 include a first adjustment trace 2122. Line lengths of the first adjustment traces 2122 are sequentially increased in a direction from the side edge of the display region 10 to the center of the display region 10.

Figure 12:
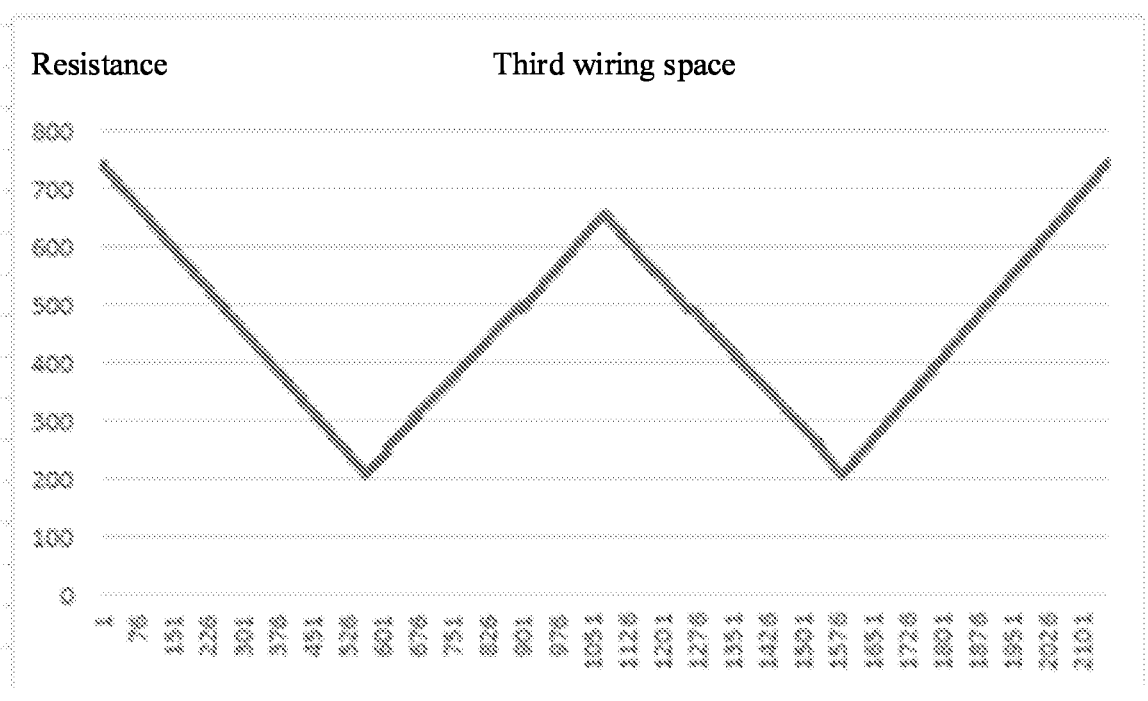
FIG. 12 is a schematic diagram of resistance distribution of sub-traces in the third wiring space.

As such, in the fourth region 242 of the third wiring space 24, the line lengths of the second adjustment traces 2126 are sequentially reduced in the direction from the side edge of the display region 10 to the center of the display region 10, such that the resistances of the sub-traces 212 in the fourth region 242 are sequentially increased in the direction from the side edge of the display region 10 to the center of the display region 10. In the fifth region 244 of the third wiring space 24, the line lengths of the first adjustment traces 2122 are sequentially increased in the direction from the side edge of the display region 10 to the center of the display region 10, such that the resistances of the sub-traces 212 in the fifth region 244 are sequentially increased in the direction from the side edge of the display region 10 to the center of the display region 10. Thus, the resistance distribution of the sub-traces 212 in the third wiring space 24 is shown in FIG. 12, a difference in the total resistances of the traces 21 is further reduced, and the difference in the luminance of the center of the display region 10 and the luminance of the two sides of the display region 10 is reduced.

Figure 13:
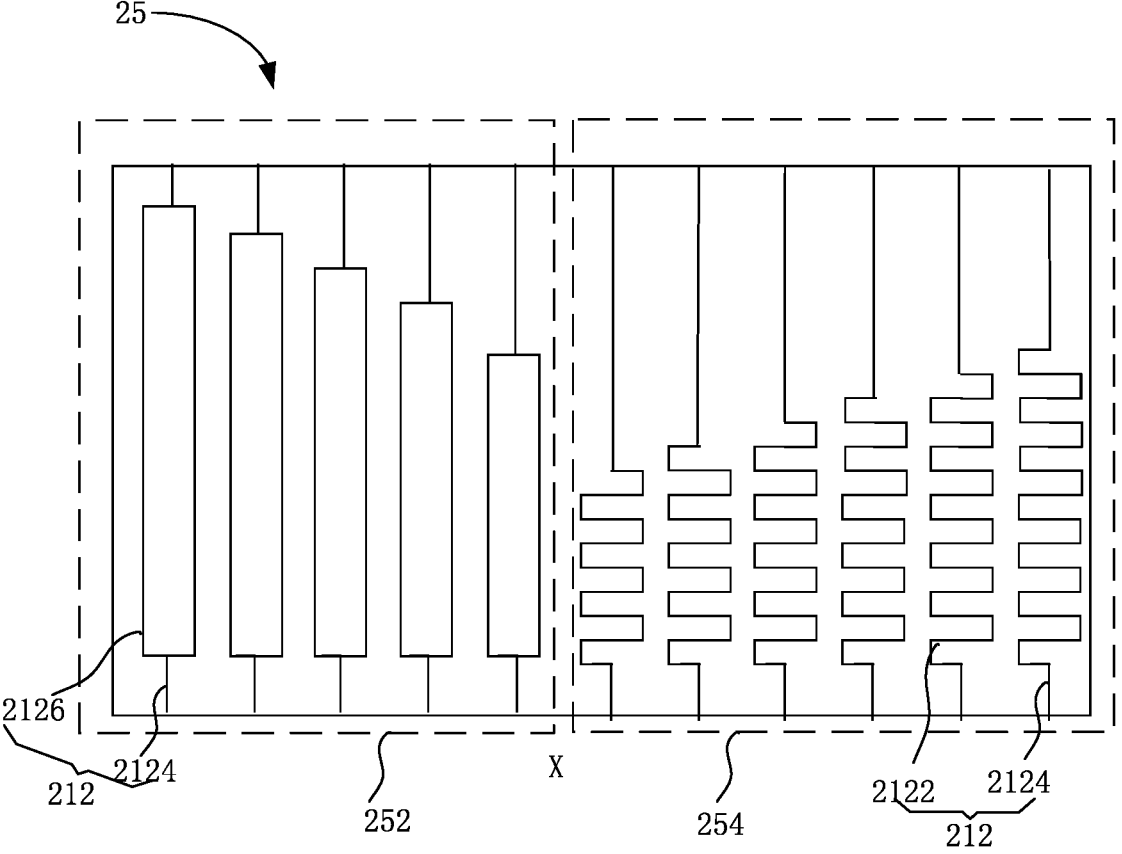
FIG. 13 is a schematic partially diagram of a sixth region and a seventh region in a fourth wiring space at a position of "X" shown in FIG. 5.

Referring to FIG. 13, in some embodiments, the fourth wiring space 25 includes a sixth region 252 and a seventh region 254 that are adjacent. Sub-traces 212 in the sixth region 252 include a second adjustment trace 2126. Line lengths of the second adjustment traces 2126 are sequentially reduced in a direction from a side edge of the display region 10 to a center of the display region 10. Sub-traces 212 in the seventh region 254 include a first adjustment trace 2122. Line lengths of the first adjustment traces 2122 are sequentially increased in the direction from the side edge of the display region 10 to the center of the display region 10.

As such, in the sixth region 252 of the fourth wiring space 25, the line lengths of the second adjustment traces 2126 are sequentially reduced in the direction from the side edge of the display region 10 to the center of the display region 10, such that the resistances of the sub-traces 212 in the sixth region 252 are sequentially increased in the direction from the side edge of the display region 10 to the center of the display region 10. In the seventh region 254 of the fourth wiring space 25, the line lengths of the first adjustment traces 2122 are sequentially increased in the direction from the side edge of the display region 10 to the center of the display region 10, such that the resistances of the sub-traces 212 in the seventh region 254 are sequentially increased in the direction from the side edge of the display region 10 to the center of the display region 10. Thus, a difference in the total resistances of the traces 21 is further reduced, and the difference in the luminance of the center of the display region 10 and the luminance of the two sides of the display region 10 is reduced.

Figure 14:
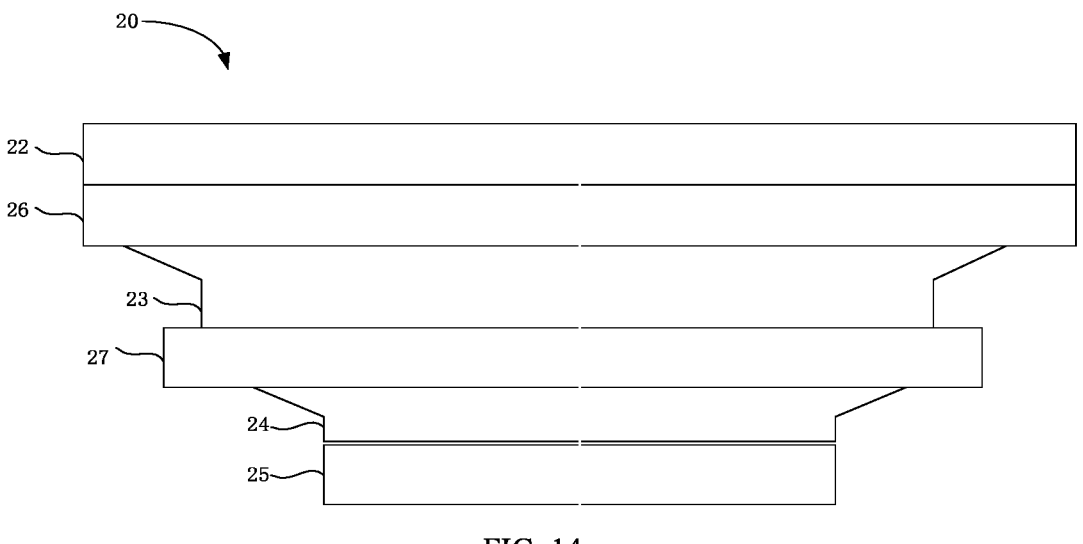
FIG. 14 is a schematic diagram of modules of another wiring structure according to some embodiments of the present disclosure.

Referring to FIG. 14, in some embodiments, the wiring structure 20 further includes a first connection space 26 and a second connection space 27. The first connection space 26 is disposed between the first wiring space 22 and the second wiring space 23, and the second connection space 27 is disposed between the second wiring space 23 and the third wiring space 24.

It should be noted that the first connection space 26 can be a bending region, and the traces 21 further includes a connection sub-trace in the first connection space 26. The connection sub-trace in the first connection space 26 are connected to the sub-traces 212 in the first wiring space 22 and the second wiring space 23.

The second connection space 27 includes other structures, for example, a signal test unit, an electrostatic release unit, and the like. The trace 21 further includes a connection sub-trace in the second connection space 27, and the connection sub-trace in the second connection space 27 are connected to the sub-traces 212 in the third wiring space 24 and the fourth wiring space 25.

Figure 15:
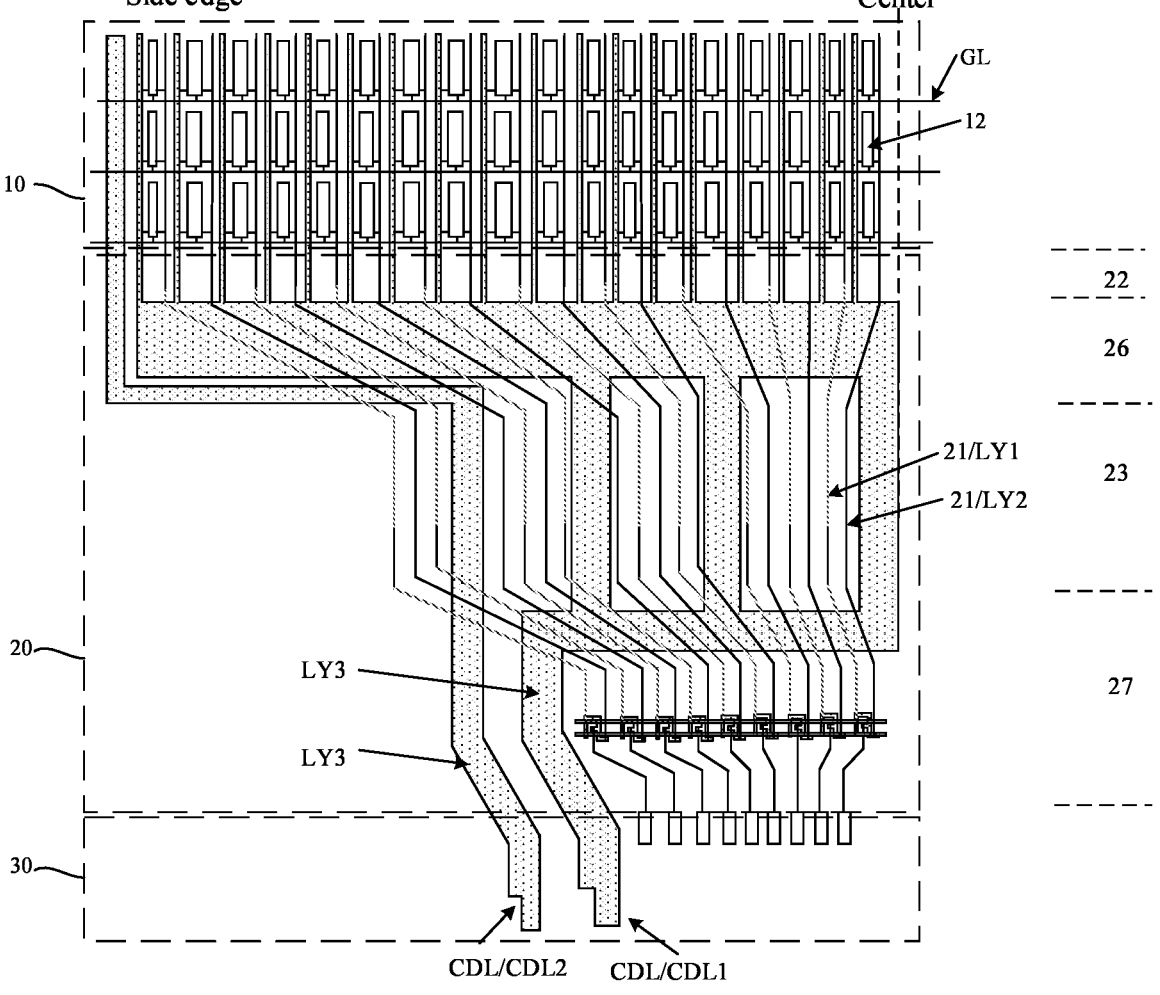
FIG. 15 is a schematic planar diagram of a display substrate according to some embodiments of the present disclosure.

In conjunction with FIG. 15, in some embodiments, the display substrate 100 further includes a conduction line CDL. The conduction line CDL is configured to be bonded with a flexible circuit board, and includes a first power signal line CDL1 and a second power signal line CDL2. The first power signal line CDL1 is configured to supply a first power voltage VDD to the pixels, and the second power signal line CDL2 is configured to supply a second power voltage VSS to the pixels. For example, the first power signal line is a VDD line, and the second power signal line is a VSS line. For example, the second power signal line CDL2 is connected to a cathode of the light-emitting diode.

In conjunction with FIG. 15, in some embodiments, the display substrate 100 further includes a plurality of gate lines GL. The plurality of gate lines GL are disposed in the display region, extend in the arrangement direction of the traces 21, and are intersected with the traces 21. The plurality of gate lines GL are electrically connected to the plurality of pixels 12 and define the plurality of pixels 12 in conjunction with the traces 21, and the plurality of gate lines GL are configured to supply a scan signal to the plurality of pixels 12.

Figure 16:
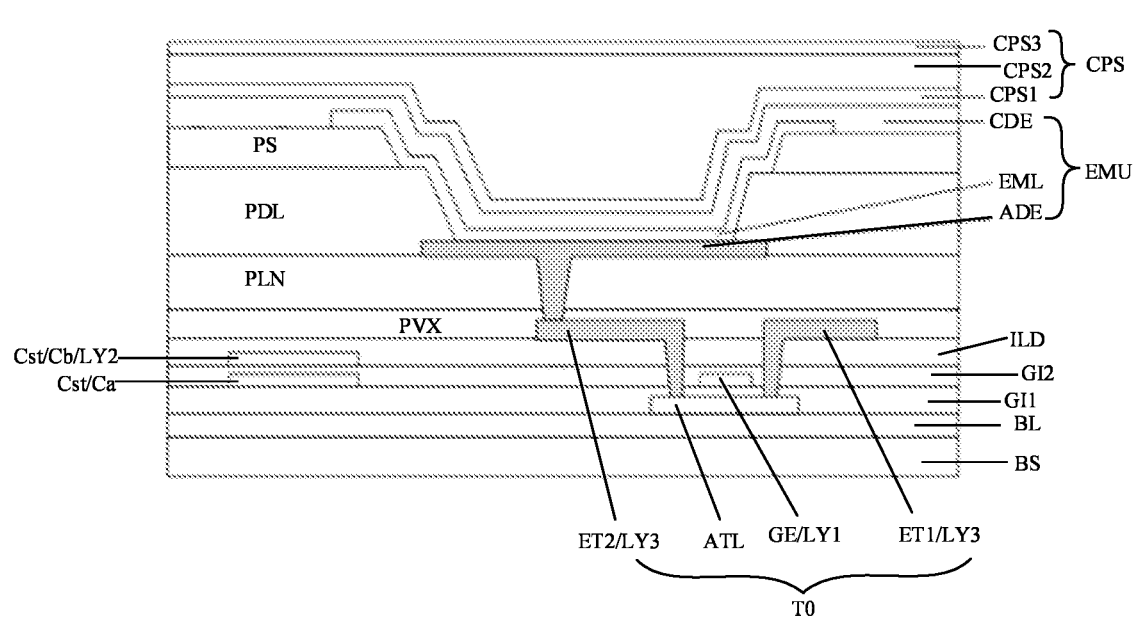
FIG. 16 is a section view of a display substrate according to some embodiments of the present disclosure.

In conjunction with FIG. 15 and FIG. 16, in some embodiments, the display substrate 100 further includes a first conduction layer LY1, a second conduction layer LY2, and a third conduction layer LY3. The first conduction layer LY1 is formed by a same film layer by a same composition process, the second conduction layer LY2 is formed by a same film layer by a same composition process, and the third conduction layer LY3 is formed by a same film layer by a same composition process.

The first conduction layer LY1, the second conduction layer LY2, and the third conduction layer LY3 are made of conduction materials, for example, at least one of a metal or an alloy. The materials of the first conduction layer LY1 and the second conduction layer LY2 are nickel, but not limited to this. For example, the metal material of the third conduction layer LY3 includes Ti—Al—Ti with a great bending resistance property.

Adjacent traces 21 are respectively disposed in the first conduction layer LY1 and the second conduction layer LY2, the gate lines GL are disposed in the first conduction layer LY1, the first power signal lines CDL1 are disposed in the third conduction layer LY3, and the second power signal lines CDL2 are disposed in the third conduction layer. For example, the second power signal lines CDL2 are connected to the cathode of the light-emitting diode through a connection member on the same layer of the anode of the light-emitting diode. The anode of the light-emitting diode and the connection member are formed by a same film layer by a same composition process and are spaced apart.

FIG. 16 is a section view of a display substrate as shown in FIG. 10 according to some embodiments of the present disclosure. In some embodiments, the display substrate 100 further includes a base substrate BS. The base substrate BS may be a flexible substrate. The plurality of pixels 12 include at least one thin-film transistor TO and storage capacitor Cst. The thin-film transistor TO is a data write transistor. The thin-film transistor TO includes an active layer ATL on the base substrate BS, a first gate insulation layer GI1 on a side, distal from the base substrate BS, of the active layer ATL, a gate GE on a side, distal from the base substrate BS, of the first gate insulation layer GI1, a second gate insulation layer GI2 on a side, distal from the base substrate BS, of the gate GE, an interlayer insulation layer ILD on a side, distal from the base substrate BS, of the second gate insulation layer GI2, and a first electrode ET1 and a second electrode ET2 on a side, distal from the base substrate BS, of the interlayer insulation layer ILD. The storage capacitor Cst includes a first plate Ca and a second plate Cb. The first plate Ca and the gate GE are disposed on a same layer, that is, the first conduction layer LY1. The second plate Cb is disposed between the second gate insulation layer GI2 and the interlayer insulation layer ILD, that is, the second conduction layer LY2. Referring to FIG. 15 and FIG. 16, a plurality of traces 21, the gate lines GE, and the first plate Ca are disposed on the same layer, that is, the first conduction layer LY1. A plurality of traces 21 and the second plate Cb are disposed on the same layer, that is, the second conduction layer LY2. One of the first electrode ET1 and the second electrode ET2 is the source, and the other of the first electrode ET1 and the second electrode ET2 is the drain. Referring to FIG. 15 and FIG. 16, the first electrode ET1 and the second electrode ET2 are disposed on the third conduction layer LY3. The display substrate further includes a passivation layer PVX and a planarization layer PLN.

As shown in FIG. 16, the display substrate 100 further includes a light-emitting unit EMU. The light-emitting unit EMU includes an anode ADE, a light-emitting function layer EML, and a cathode CDE. The anode ADE is connected to the second electrode ET2 by perpetrating via holes of the passivation layer PVX and the planarization layer PLN. The first electrode ET1 is connected to the data line, for example, the first electrode ET1 and the traces are formed integrally. The display substrate 100 further includes an encapsulation layer CPS. The encapsulation layer CPS includes a first encapsulation layer CPS1, a second encapsulation layer CPS2, and a third encapsulation layer CPS3. For example, the first encapsulation layer CPS1 and the third encapsulation layer CPS3 are inorganic material layers, and the second encapsulation layer CPS2 is an organic material layer.

As shown in FIG. 6, the display substrate 100 further includes a pixel definition layer PDL and a spacer PS. The pixel definition layer PDL is configured to define an opening of the pixel, and the spacer PS is configured to support a fine metal mask in forming the light-emitting function layer EML.

For example, one of the anode and the cathode of the light-emitting unit EMU is connected to the driving transistor, and the driving transistor is configured to supply a driving current to the light-emitting unit EMU to drive the light-emitting unit EMU to emit the light.

In some embodiments, the display substrate 100 further includes a light-emitting control transistor, a reset transistor, and other transistors other than the driving transistor and the data write transistor. For example, the pixel circuit of the display substrate is a 7T1C structure (that is, seven transistors and one capacitor), or a structure with other number of transistors, for example, a 7T2C structure, a 6T1C structure, a 6T2C structure, or a 9T2C structure, which is not limited in the embodiments of the present disclosure.

It should be noted that the transistors in the embodiments of the present disclosure is thin-film transistors, field effect transistors or other switching devices with the same characteristics, and the thin-film transistors may include oxide semiconductor thin-film transistors, amorphous silicon thin-film transistors, or polycrystalline silicon thin-film transistors. The source and drain of the transistor can be symmetrical, and thus the source and drain are not different in physical structure. In some embodiments of the present disclosure, in addition to the gate as the control electrode, one electrode is directly described as the first electrode and the other electrode as the second electrode for distinguishing the transistors, and thus the first electrode and second electrode of all or part of the transistors in the embodiments of the present disclosure are interchangeable as required.

The embodiments of the present disclosure further provide a display device. The display device includes the display substrate 100 in any one of the above embodiments. For example, the display device includes an OLED display device, but is not limited to this. The display device further includes a liquid crystal display device.

For example, the display device includes the OLED display device, the liquid crystal display device, or other product or device having a display function, such as a computer, a mobile phone, a watch, an electronic picture frame, a navigator, and the like.

Figure 17:
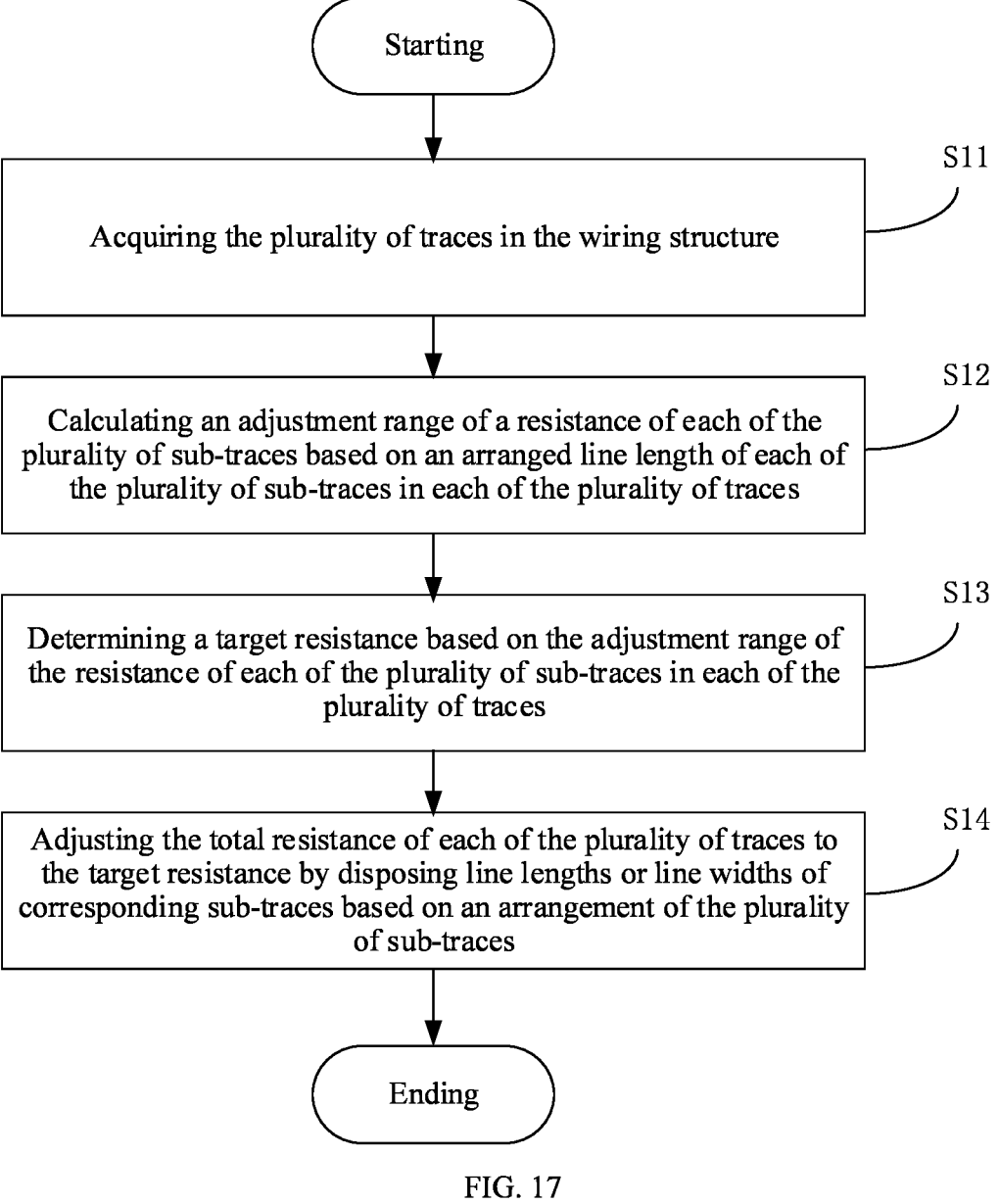

Referring to FIG. 17, in addition, the embodiments of the present disclosure further provide a wiring method. The wiring method is applicable to the above display device, and includes the following processes.

In S11, the plurality of traces in the wiring structure are acquired.

In S12, an adjustment range of a resistance of each of the plurality of sub-traces is calculated based on an arranged line length of each of the plurality of sub-traces in each of the plurality of traces.

In S13, a target resistance is determined based on the adjustment range of the resistance of each of the plurality of sub-traces in each of the plurality of traces.

In S14, the total resistance of each of the plurality of traces is adjusted to the target resistance by disposing line lengths or line widths of corresponding sub-traces based on an arrangement of the plurality of sub-traces.

As such, by adjusting the line lengths or line widths of the sub-traces in the wiring space, the total resistance of the trace is adjusted to the target resistance, such that the traces in the wiring structure are basically the same, and the uniformity of the luminance of the display screen is further improved.

Referring to FIG. 18, in some embodiments, S13 further includes the following sub-steps.

In S132, an estimation resistance corresponding to each of the plurality of traces is determined based on an arranged line length of each of the plurality of traces.

In S134, a first limit value of each sub-trace with added line width in a trace with a maximum estimation resistance and a second limit value of each sub-trace with added line length in a trace with a minimum estimation resistance are determined based on the estimation resistance corresponding to each of the plurality of traces and the adjustment range of a resistance of each of the plurality of sub-traces in the trace.

In S136, the target resistance is determined based on the first limit value and the second limit value.

As such, the line lengths or line widths of the sub-traces are set by determining the adjustment range of each trace based on the target resistance.

Referring to FIG. 19, in some embodiments, S136 further includes the following sub-steps.

In S1362, the first limit value, the second limit value, or any value between the first limit value and the second limit value is determined as the target resistance in the case that the first limit value is less than or equal to the second limit value.

In S1364, the target resistance of each trace is determined based on the estimation resistance of each trace and the adjustment range of the resistance of each sub-trace in the trace in the case that the first limit value is greater than or equal to the second limit value.

It should be noted that in the case that the first limit value is less than the second limit value, the total resistances of the traces are equal by setting the line lengths or line widths of the traces. Thus, the target resistance is the first limit value, the second limit value, or any value between the first limit value and the second limit value in the case that the first limit value is less than or equal to the second limit value.

In the case that the first limit value is greater than or equal to the second limit value, the total resistances of the traces are not equal by setting the line lengths or line widths of the trace with a maximum total resistance and the trace with a minimum total resistance. Thus, the target resistance of each trace is determined based on the estimation resistance of each trace and the adjustment range of the resistance of each sub-trace in the trace in the case that the first limit value is greater than or equal to the second limit value.

Referring to FIG. 20 in some embodiments, S1364 further includes the following sub-steps.

In S13642, a minimum resistance of each sub-trace with added line width in each trace is determined based on the estimation resistance of each trace and the adjustment range of the resistance of each sub-trace in the trace.

In S13644, the corresponding minimum resistance is determined as the target resistance of the trace in the case that the minimum resistance of the trace is greater than or equal to the second limit value.

In S13646, the second limit value is determined as the target resistance of the trace in the case that the minimum resistance of the trace is less than the second limit value.

Referring to FIG. 21 in some embodiments, S1364 further includes the following sub-steps.

In S13641, a maximum resistance of each sub-trace with added line length in each trace is determined based on the estimation resistance of each trace and the adjustment range of the resistance of each sub-trace in the trace.

In S13643, the corresponding maximum resistance is determined as the target resistance of the trace in the case that the maximum resistance of the trace is less than or equal to the first limit value.

In S13645, the first limit value is determined as the target resistance of the trace in the case that the maximum resistance of the trace is greater than the first limit value.

Referring to FIG. 22 in some embodiments, S14 further includes the following sub-steps.

In S152, the total resistance of the trace is adjusted to the corresponding target resistance by adding the line width of the corresponding sub-trace in the case that the estimation resistance of the trace is greater than the corresponding target resistance.

In S154, the total resistance of the trace is adjusted to the corresponding target resistance by adding the line length of the corresponding sub-trace in the case that the estimation resistance of the trace is less than the corresponding target resistance.

It should be noted that the resistance of the trace is reduced by adding the line width of the corresponding sub-trace of the trace, and the total resistance of the trace is increased by adding the line length of the corresponding sub-trace of the trace. The total resistance of the trace is reduced to match the target resistance by adding the line width of the corresponding sub-trace in the case that the estimation resistance of the trace is greater than the corresponding target resistance. The total resistance of the trace is increased to match the corresponding target resistance by adding the line length of the corresponding sub-trace in the case that the estimation resistance of the trace is less than the corresponding target resistance.

In the descriptions of the present specification, the descriptions about reference terms such as "an embodiment," "some embodiments," "exemplary embodiments," "examples," "some specific examples," "some examples," and the like mean that the specific features, structures, materials or characteristics described in combination with the embodiments or examples are included in at least one embodiment or example of the present disclosure. In the present specification, the schematic descriptions of the above terms do not necessarily refer to a same embodiment or example. Furthermore, the specific features, structures, materials or characteristics as described can be integrated with any one or more embodiments or examples in a proper manner.

Although the embodiments of the present disclosure have been shown and described above, it can be understood by a person of ordinary skill in the art that the above embodiments can be changed, modified, substituted and varied without departing from the principles and purposes of the present disclosure, and the scope of the present disclosure are defined by claims and their equivalents.

The invention claimed is:

1. A display substrate, comprising:
 a display region and a bonding region on a side of the display region, wherein the display region comprises a plurality of pixel columns that are sequentially arranged; and
 a wiring structure, disposed between the display region and the bonding region and comprising a plurality of traces that are sequentially arranged, wherein one of the plurality of traces corresponds to one of the plurality of pixel columns, the plurality of traces are electrically connected to the plurality of pixel columns to supply an electric signal to pixels in the plurality of pixel columns, and each of the plurality of traces comprises a plurality of sub-traces, wherein at least one of line lengths and line widths of sub-traces corresponding to at least a part of the plurality of traces are different, such that total resistances of the at least the part of the plurality of traces are basically equal;
 wherein the wiring structure further comprises a first wiring space, a second wiring space, and a third wiring space that are sequentially arranged, wherein the first wiring space is proximal to the display region, and the plurality of sub-traces are arranged in at least one of the first wiring space, the second wiring space, and the third wiring space.

2. The display substrate according to claim 1, wherein in the first wiring space, each of the plurality of sub-traces comprises a first adjustment trace with a line length within a unit distance greater than a predetermined length, wherein line lengths of the first adjustment traces are sequentially increased in a direction from a side edge of the display region to a center of the display region.

3. The display substrate according to claim 1, wherein the second wiring space comprises a first region and a second region that are disposed proximal to a side edge of the display region and are adjacent to each other; wherein in the first region, each of the plurality of sub-traces comprises a first adjustment trace, wherein line lengths of the first adjustment traces are sequentially increased in a direction from the side edge of the display region to a center of the display region; and in the second region, each of the plurality of sub-traces comprises a second adjustment trace with a line width greater than a predetermined width, wherein line lengths of the second adjustment traces are sequentially reduced in the direction from the side edge of the display region to the center of the display region.

4. The display substrate according to claim 1, wherein the second wiring space comprises a third region, the third region comprising a plurality of sub-regions, wherein in each of the plurality of sub-regions, each of the plurality of sub-traces comprises a first adjustment trace, wherein line lengths of the first adjustment traces are sequentially increased in a direction from a side edge of the display region to a center of the display region.

5. The display substrate according to claim 4, wherein the plurality of sub-regions comprise a first sub-region and a second sub-region that are adjacent; wherein in the first sub-region, the line lengths of the first adjustment traces are sequentially increased from a first line length in the direction from the side edge of the display region to the center of the display region; and in the second sub-region, the line lengths of the first adjustment traces are sequentially increased from a second line length in the direction from the side edge of the display region to the center of the display region, and the second line length is greater than the first line length.

6. The display substrate according to claim 1, wherein the third wiring space comprises a fourth region and a fifth region that are adjacent; wherein sub-traces in the fourth region comprise a second adjustment trace, wherein line lengths of the second adjustment traces are sequentially reduced in a direction from a side edge of the display region to a center of the display region; and sub-traces in the fifth region comprise a first adjustment trace, wherein line lengths of the first adjustment traces are sequentially increased in a direction from the side edge of the display region to the center of the display region.

7. The display substrate according to claim 1, wherein the wiring structure comprises a fourth wiring space, the fourth wiring space comprising a sixth region and a seventh region that are adjacent; wherein sub-traces in the sixth region comprise a second adjustment trace, wherein line lengths of the second adjustment traces are sequentially reduced in a direction from a side edge of the display region to a center of the display region; and sub-traces in the seventh region comprise a first adjustment trace, wherein line lengths of the first adjustment traces are sequentially increased in the direction from the side edge of the display region to the center of the display region.

8. The display substrate according to claim 1, wherein the wiring structure further comprises:

a first connection space, wherein the first connection space is disposed between the first wiring space and the second wiring space, and each of the plurality of traces comprises a connection sub-trace in the first connection space; and a second connection space, wherein the second connection space is disposed between the second wiring space and the third wiring space, and each of the plurality of traces comprises a connection sub-trace in the second connection space.

9. The display substrate according to claim 1, wherein each of the plurality of sub-traces comprises a first adjustment trace bending and extending in a wiring direction.

10. The display substrate according to claim 1, further comprising: a conduction line, wherein the conduction line is configured to be bonded to a flexible circuit board, and comprises a first power signal line and a second power signal line, wherein the first power signal line is configured to supply a first power voltage to the pixels, and the second power signal line is configured to supply a second power voltage to the pixels.

11. The display substrate according to claim 1, further comprising: a first conduction layer and a second conduction layer, wherein adjacent traces are respectively disposed in the first conduction layer and the second conduction layer.

12. The display substrate according to claim 1, further comprises: a base substrate, wherein the pixel comprises at least one thin-film transistor and storage capacitor; wherein the at least one thin-film transistor comprises an active layer on the base substrate, a first gate insulation layer on a side, distal from the base substrate, of the active layer, a gate on a side, distal from the base substrate, of the first gate insulation layer, a second gate insulation layer on a side, distal from the base substrate, of the gate, an interlayer insulation layer on a side, distal from the base substrate, of the second gate insulation layer, and a source and drain on a side, distal from the base substrate, of the interlayer insulation layer; and the storage capacitor comprises a first plate and a second plate, wherein the first plate and the gate are disposed on a same layer, and the second plate is disposed between the second gate insulation layer and the interlayer insulation layer.

13. The display substrate according to claim 12, wherein at least a part of the plurality of traces and the first plate are disposed on a same layer, and at least a part of the plurality of traces and the second plate are disposed on a same layer, and the at least the part of the plurality of traces on the same layer as the first plate and the at least the part of the plurality of traces on the same layer as the second plate are alternately disposed.

14. A display device, comprising: a display substrate, wherein the display substrate includes:

a display region and a bonding region on a side of the display region, wherein the display region comprises a plurality of pixel columns that are sequentially arranged; and a wiring structure, disposed between the display region and the bonding region and comprising a plurality of traces that are sequentially arranged, wherein one of the plurality of traces corresponds to one of the plurality of pixel columns, the plurality of traces are electrically connected to the plurality of pixel columns to supply an electric signal to pixels in the plurality of pixel columns, and each of the plurality of traces comprises a plurality of sub-traces, wherein at least one of line lengths and line widths of sub-traces corresponding to at least a part of the plurality of traces are different, such that total resistances of the at least the part of the plurality of traces are basically equal;

wherein the wiring structure further comprises a first wiring space, a second wiring space, and a third wiring space that are sequentially arranged, wherein the first wiring space is proximal to the display region, and the plurality of sub-traces are arranged in at least one of the first wiring space, the second wiring space, and the third wiring space.

15. A wiring method, applicable to the display device as defined in claim 14, the wiring method comprising:

acquiring the plurality of traces in the wiring structure;

calculating an adjustment range of a resistance of each of the plurality of sub-traces based on an arranged line length of each of the plurality of sub-traces in each of the plurality of traces;

determining a target resistance based on the adjustment range of the resistance of each of the plurality of sub-traces in each of the plurality of traces; and adjusting the total resistance of each of the plurality of traces to the target resistance by disposing line lengths or line widths of corresponding sub-traces based on an arrangement of the plurality of sub-traces.

16. The display device according to claim 14, wherein in the first wiring space, each of the plurality of sub-traces comprises a first adjustment trace with a line length within a unit distance greater than a predetermined length, wherein line lengths of the first adjustment traces are sequentially increased in a direction from a side edge of the display region to a center of the display region.

17. The display device according to claim 14, wherein the second wiring space comprises a first region and a second region that are disposed proximal to a side edge of the display region and are adjacent to each other; wherein in the first region, each of the plurality of sub-traces comprises a first adjustment trace, wherein line lengths of the first adjustment traces are sequentially increased in a direction from the side edge of the display region to a center of the display region; and in the second region, each of the plurality of sub-traces comprises a second adjustment trace with a line width greater than a predetermined width, wherein line lengths of the second adjustment traces are sequentially reduced in the direction from the side edge of the display region to the center of the display region.

18. The display device according to claim 14, wherein the second wiring space comprises a third region, the third region comprising a plurality of sub-regions, wherein in each of the plurality of sub-regions, each of the plurality of sub-traces comprises a first adjustment trace, wherein line lengths of the first adjustment traces are sequentially increased in a direction from a side edge of the display region to a center of the display region.

* * * * *